United States Patent
Yu et al.

(10) Patent No.: US 10,685,910 B2
(45) Date of Patent: *Jun. 16, 2020

(54) PACKAGES WITH SI-SUBSTRATE-FREE INTERPOSER AND METHOD FORMING SAME

(71) Applicant: Taiwan Semiconductor Manufacturing Company, Ltd., Hsinchu (TW)

(72) Inventors: Chen-Hua Yu, Hsinchu (TW); Sung-Feng Yeh, Taipei (TW); Ming-Fa Chen, Taichung (TW); Hsien-Wei Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/538,179

(22) Filed: Aug. 12, 2019

(65) Prior Publication Data
US 2019/0363045 A1    Nov. 28, 2019

Related U.S. Application Data

(60) Continuation of application No. 16/204,628, filed on Nov. 29, 2018, now Pat. No. 10,381,298, which is a
(Continued)

(51) Int. Cl.
*H01L 23/498* (2006.01)
*H01L 25/10* (2006.01)
(Continued)

(52) U.S. Cl.
CPC ...... *H01L 23/49827* (2013.01); *H01L 21/561* (2013.01); *H01L 21/568* (2013.01);
(Continued)

(58) Field of Classification Search
CPC combination set(s) only.
See application file for complete search history.

(56) References Cited

U.S. PATENT DOCUMENTS 7,421,777 B2    9/2008   Asami et al.
7,514,797 B2    4/2009   Chen et al.
(Continued)

FOREIGN PATENT DOCUMENTS

CN    101315924 A    12/2008
CN    103515305 A    1/2014
(Continued)

OTHER PUBLICATIONS

Lu, Jian-Qiang, "3-D Hyperintegration and Packaging Technologies for Micro-Nano Systems," Proceedings of the IEEE, vol. 97, No. 1, Jan. 2009, 14 pages.

*Primary Examiner* — Ratisha Mehta
(74) *Attorney, Agent, or Firm* — Slater Matsil, LLP

(57) ABSTRACT

A method includes forming a plurality of dielectric layers, forming a plurality of redistribution lines in the plurality of dielectric layers, forming stacked vias in the plurality of dielectric layers with the stacked vias forming a continuous electrical connection penetrating through the plurality of dielectric layers, forming a dielectric layer over the stacked vias and the plurality of dielectric layers, forming a plurality of bond pads in the dielectric layer, and bonding a device die to the dielectric layer and a first portion of the plurality of bond pads through hybrid bonding.

20 Claims, 38 Drawing Sheets

Related U.S. Application Data division of application No. 15/707,237, filed on Sep. 18, 2017, now Pat. No. 10,290,571.

(51) Int. Cl.
*H01L 25/00* (2006.01)
*H01L 21/683* (2006.01)
*H01L 25/065* (2006.01)
*H01L 21/56* (2006.01)
*H01L 23/00* (2006.01)
*H01L 23/31* (2006.01)

(52) U.S. Cl.
CPC .......... *H01L 21/6835* (2013.01); *H01L 24/03* (2013.01); *H01L 24/11* (2013.01); *H01L 24/13* (2013.01); *H01L 24/19* (2013.01); *H01L 24/20* (2013.01); *H01L 24/81* (2013.01); *H01L 24/96* (2013.01); *H01L 25/0657* (2013.01); *H01L 25/105* (2013.01); *H01L 25/50* (2013.01); *H01L 23/3128* (2013.01); *H01L 2221/68327* (2013.01); *H01L 2221/68331* (2013.01); *H01L 2221/68345* (2013.01); *H01L 2221/68381* (2013.01); *H01L 2224/02333* (2013.01); *H01L 2224/02379* (2013.01); *H01L 2224/04105* (2013.01); *H01L 2224/13147* (2013.01); *H01L 2224/48091* (2013.01); *H01L 2224/48227* (2013.01); *H01L 2924/00014* (2013.01); *H01L 2924/181* (2013.01)

(56) References Cited

U.S. PATENT DOCUMENTS

| | | |
|---|---|---|
| 8,008,130 B2 | 8/2011 | Honda |
| 8,361,842 B2 | 1/2013 | Yu et al. |
| 8,680,647 B2 | 3/2014 | Yu et al. |
| 8,703,542 B2 | 4/2014 | Lin et al. |
| 8,759,964 B2 | 6/2014 | Pu et al. |
| 8,778,738 B1 | 7/2014 | Lin et al. |
| 8,785,299 B2 | 7/2014 | Mao et al. |
| 8,803,306 B1 | 8/2014 | Yu et al. |
| 8,809,996 B2 | 8/2014 | Chen et al. |
| 8,829,676 B2 | 9/2014 | Yu et al. |
| 8,877,554 B2 | 11/2014 | Tsai et al. |
| 8,946,884 B2 | 2/2015 | Kwon et al. |
| 9,182,017 B2 | 11/2015 | Yoshida et al. |
| 9,425,150 B2 | 8/2016 | Huang et al. |
| 9,520,333 B1 | 12/2016 | Shih et al. |
| 9,576,821 B2 | 2/2017 | Lo et al. |
| 9,583,460 B2 | 2/2017 | Ray et al. |
| 9,653,433 B2 | 5/2017 | Yu et al. |
| 9,666,520 B2 | 5/2017 | Yu et al. |
| 9,728,453 B2 | 8/2017 | Tseng et al. |
| 10,109,613 B2 | 10/2018 | Lin et al. |
| 10,269,768 B2 | 4/2019 | Ho et al. |
| 10,319,699 B2 | 6/2019 | Wei et al. |
| 2007/0006435 A1 | 1/2007 | Banerji et al. |
| 2010/0123241 A1 | 5/2010 | Shi et al. |
| 2011/0068468 A1 | 3/2011 | Lin et al. |
| 2011/0248396 A1 | 10/2011 | Liu et al. |
| 2011/0291288 A1 | 12/2011 | Wu et al. |
| 2012/0112322 A1 | 5/2012 | Lin et al. |
| 2013/0026468 A1 | 1/2013 | Yoshimuta et al. |
| 2013/0062760 A1 | 3/2013 | Hung et al. |
| 2013/0062761 A1 | 3/2013 | Lin et al. |
| 2013/0168848 A1 | 7/2013 | Lin et al. |
| 2013/0307140 A1 | 11/2013 | Huang et al. |
| 2014/0203429 A1 | 7/2014 | Yu et al. |
| 2014/0225222 A1 | 8/2014 | Yu et al. |
| 2014/0252646 A1 | 9/2014 | Hung et al. |
| 2014/0262475 A1 | 9/2014 | Liu et al. |
| 2014/0263586 A1 | 9/2014 | Huang et al. |
| 2014/0264930 A1 | 9/2014 | Yu et al. |
| 2014/0264948 A1 | 9/2014 | Chou et al. |
| 2014/0375408 A1 | 12/2014 | Yen et al. |
| 2015/0108644 A1 | 4/2015 | Kuang et al. |
| 2015/0171006 A1 | 6/2015 | Hung et al. |
| 2015/0270247 A1 | 9/2015 | Chen et al. |
| 2015/0318246 A1 | 11/2015 | Yu et al. |
| 2015/0318263 A1 | 11/2015 | Yu et al. |
| 2015/0318267 A1 | 11/2015 | Yu et al. |
| 2016/0013133 A1 | 1/2016 | Gu et al. |
| 2016/0181215 A1 | 6/2016 | Sullivan et al. |
| 2016/0240465 A1 | 8/2016 | Chen |
| 2016/0372395 A1 | 12/2016 | Shih et al. |
| 2017/0025349 A1 | 1/2017 | Wood |
| 2017/0032977 A1 | 2/2017 | Chen et al. |
| 2017/0117200 A1 | 4/2017 | Kim et al. |
| 2017/0164458 A1 | 6/2017 | Vrtis et al. |
| 2017/0170155 A1 | 6/2017 | Yu et al. |
| 2017/0186728 A1 | 6/2017 | Chainer |
| 2017/0207197 A1 | 7/2017 | Yu et al. |
| 2017/0330767 A1 | 11/2017 | Kang et al. |
| 2018/0006006 A1 | 1/2018 | Kim et al. |

FOREIGN PATENT DOCUMENTS

| | | |
|---|---|---|
| CN | 103579204 A | 2/2014 |
| CN | 104377192 A | 2/2015 |
| CN | 105321903 A | 2/2016 |
| CN | 106257658 A | 12/2016 |
| CN | 106328608 A | 1/2017 |
| JP | 2001177010 A | 6/2001 |
| JP | 2003298232 A | 10/2003 |
| KR | 20150125582 A | 11/2015 |
| KR | 20160122769 A | 10/2016 |
| TW | 201436069 A | 9/2014 |
| TW | 201501242 A | 1/2015 |
| TW | M531651 U | 11/2016 |
| TW | 201705362 A | 2/2017 |
| WO | 2015171288 A1 | 11/2015 |

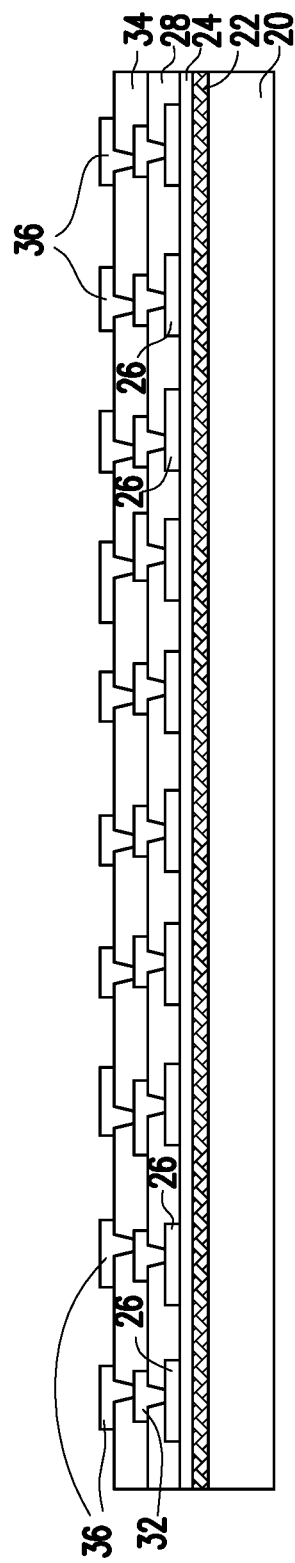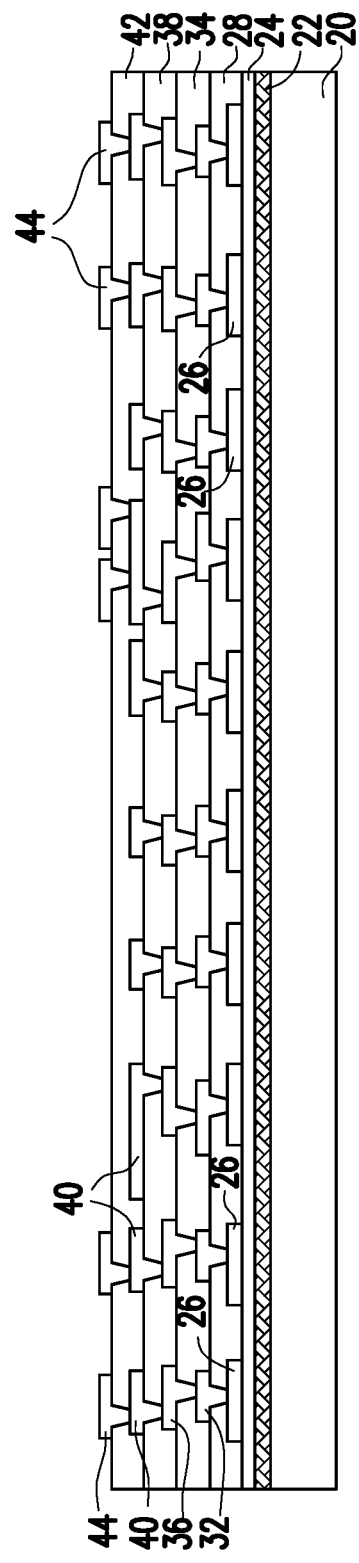

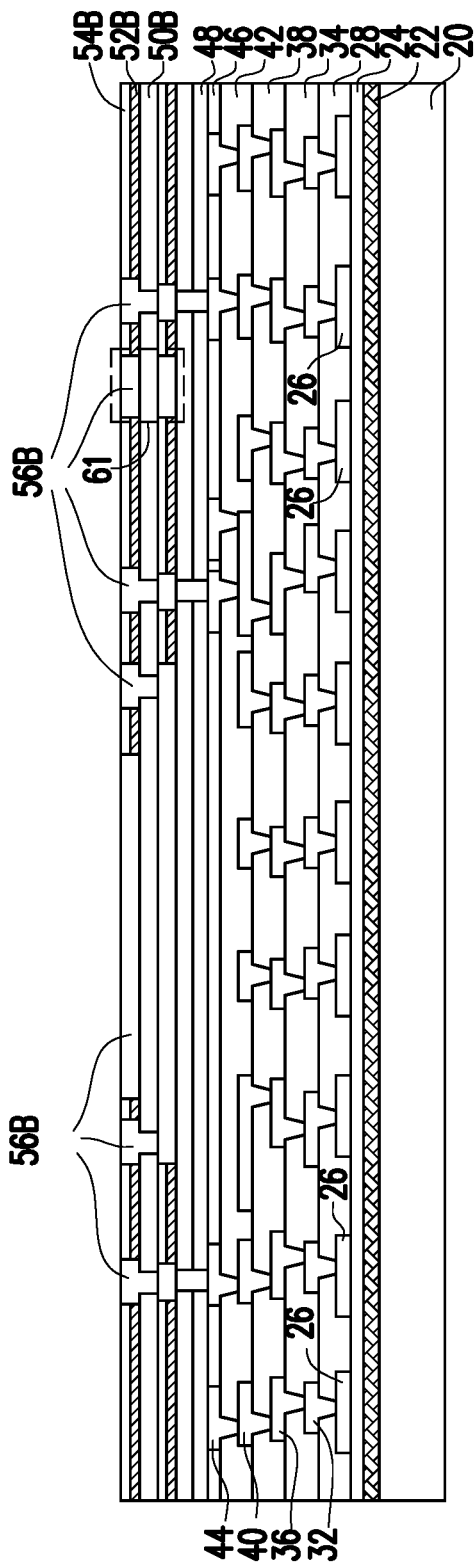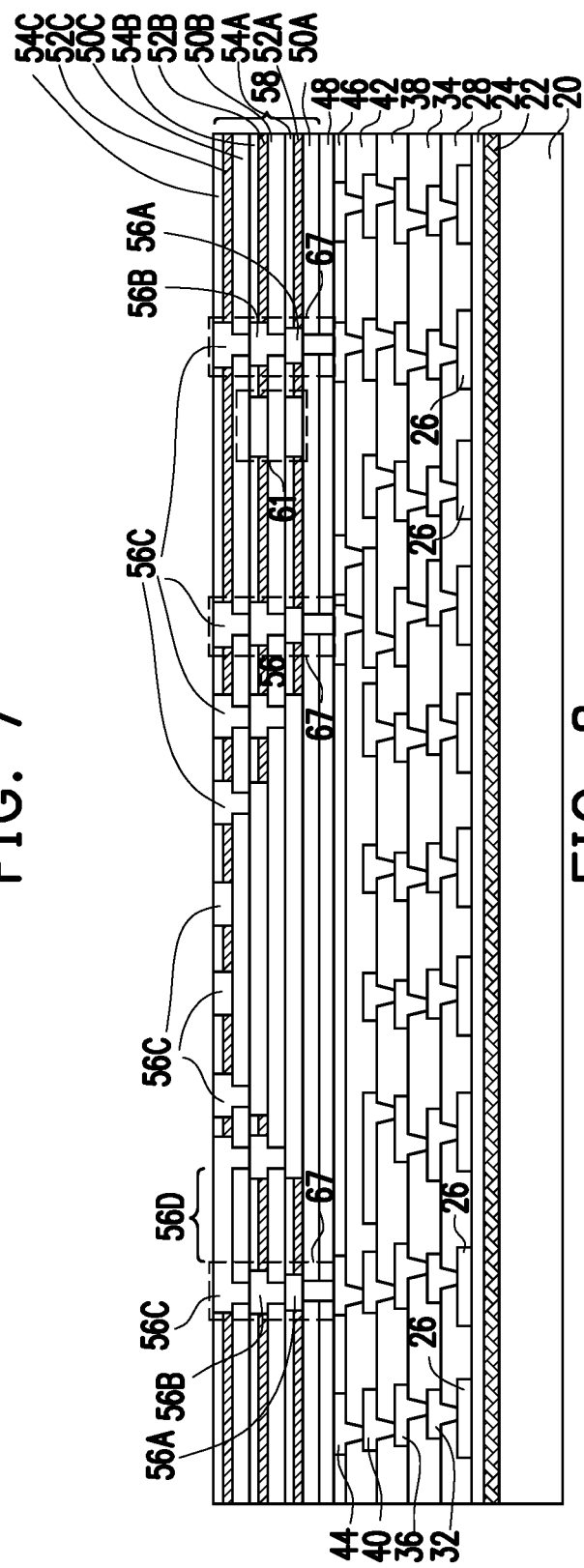
FIG. 7
FIG. 8

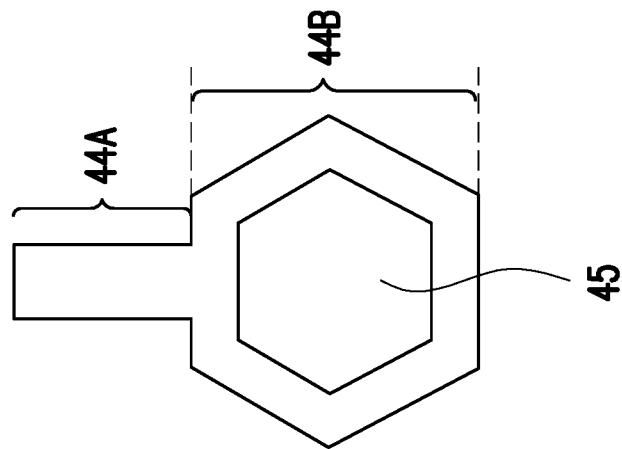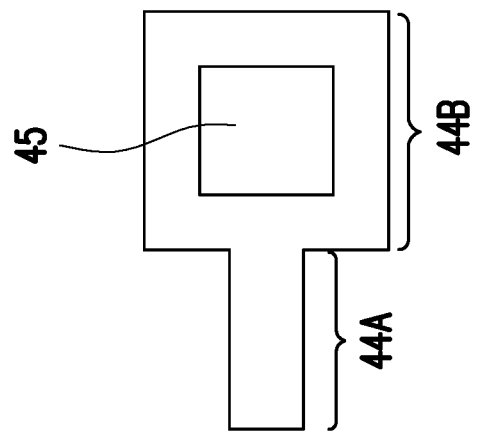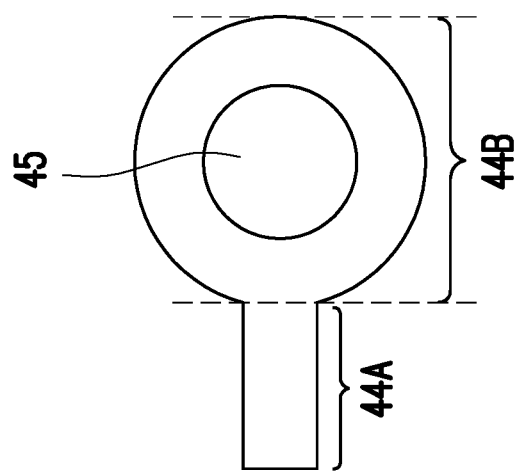
FIG. 38

PACKAGES WITH SI-SUBSTRATE-FREE INTERPOSER AND METHOD FORMING SAME

PRIORITY CLAIM AND CROSS-REFERENCE

This application is a continuation of U.S. patent application Ser. No. 16/204,628, entitled "Packages with Si-Substrate-Free Interposer and Method Forming Same," filed on Nov. 29, 2018, which is divisional of U.S. patent application Ser. No. 15/707,237, entitled "Packages with Si-Substrate-Free Interposer and Method Forming Same," filed on Sep. 18, 2017, now U.S. Pat. No. 10,290,571 issued May 14, 2019, which applications are incorporated herein by reference.

BACKGROUND

The packages of integrated circuits are becoming increasing complex, with more device dies packaged in the same package to achieve more functions. For example, a package may include a plurality of device dies such as processors and memory cubes bonded to a same interposer. The interposer may be formed based on a semiconductor substrate, with through-silicon vias formed in the semiconductor substrate to interconnect the features formed on the opposite sides of the interposer. A molding compound encapsulates the device dies therein. The package including the interposer and the device dies are further bonded to a package substrate. In addition, surface mount devices may also be bonded to the substrate. A heat spreader may be attached to the top surfaces of the device dies in order to dissipate the heat generated in the device dies. The heat spreader may have a skirt portion fixed onto the package substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 27A illustrate the cross-sectional views of intermediate stages in the formation of silicon-substrate-free (Si-less) packages in accordance with some embodiments.

FIG. 38 illustrate some top views of self-align metal pads used in Si-less packages in accordance with some embodiments.

DETAILED DESCRIPTION

Figure 1:
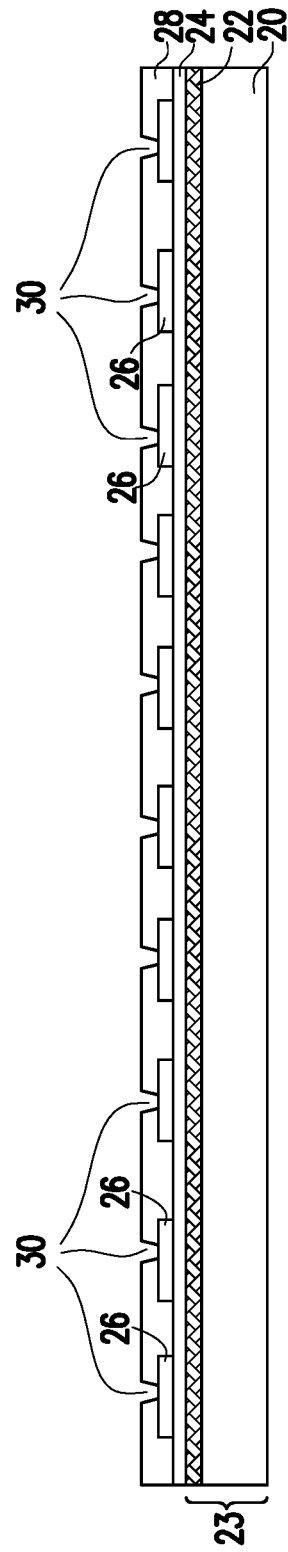

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package formed based on a silicon-substrate-free (Si-less) interposer and the method of forming the same are provided in accordance with various exemplary embodiments. The intermediate stages of forming the package are illustrated in accordance with some embodiments. Some variations of some embodiments are discussed. Throughout the various views and illustrative embodiments, like reference numbers are used to designate like elements.

FIGS. 1 through 27A illustrate the cross-sectional views of intermediate stages in the formation of a package in accordance with some embodiments of the present disclosure. The steps shown in FIGS. 1 through 27A are also reflected schematically in the process flow 300 shown in FIG. 39.

FIG. 1 illustrates carrier 20 and release layer 22 formed on carrier 20. Carrier 20 may be a glass carrier, a silicon wafer, an organic carrier, or the like. Carrier 20 may have a round top-view shape, and may have a size of a common silicon wafer. For example, carrier 20 may have an 8-inch diameter, a 12-inch diameter, or the like. Release layer 22 may be formed of a Light To Heat Conversion (LTHC) material, which may be removed along with carrier 20 from the overlying structures that will be formed in subsequent steps. In accordance with some embodiments of the present disclosure, release layer 22 is formed of an epoxy-based thermal-release material. Release layer 22 may be coated onto carrier 20. The top surface of release layer 22 is leveled and has a high degree of co-planarity. In accordance with alternative embodiments, instead of using carrier 20 and release layer 22, a silicon wafer, which is marked as 23. Dielectric layer 24 is formed on release layer 22. In accordance with some embodiments of the present disclosure, dielectric layer 24 is formed of a a non-polymer (inorganic material), which may be silicon oxide, silicon nitride, silicon oxynitride, or the like. When the silicon wafer is used, layer 24 may be formed directly on silicon wafer 23.

Redistribution Lines (RDLs) 26 are formed over dielectric layer 24. The formation of RDLs 26 may include forming a seed layer (not shown) over dielectric layer 24, forming a patterned mask (not shown) such as a photo resist over the seed layer, and then performing a metal plating on the exposed seed layer. The patterned mask and the portions of the seed layer covered by the patterned mask are then removed, leaving RDLs 26 as in FIG. 1. In accordance with some embodiments of the present disclosure, the seed layer includes a titanium layer and a copper layer over the titanium layer. The seed layer may be formed using, for example, Physical Vapor Deposition (PVD). The plating may be performed using, for example, electro-less plating.

Further referring to FIG. 1, dielectric layer 28 is formed on RDLs 26. The bottom surface of dielectric layer 28 is in contact with the top surfaces of RDLs 26 and dielectric layer 24. In accordance with some embodiments of the present disclosure, dielectric layer 28 is formed of a non-polymer (inorganic material), which may be silicon oxide, silicon nitride, or the like. In accordance with some embodiments of the present disclosure, dielectric layer 28 is formed of a polymer, which may be polyimide, Polybenzoxazole (PBO), or the like. Dielectric layer 28 is then patterned to form openings 30 therein. Hence, some portions of RDLs 26 are exposed through the openings 30 in dielectric layer 28.

Figure 2:
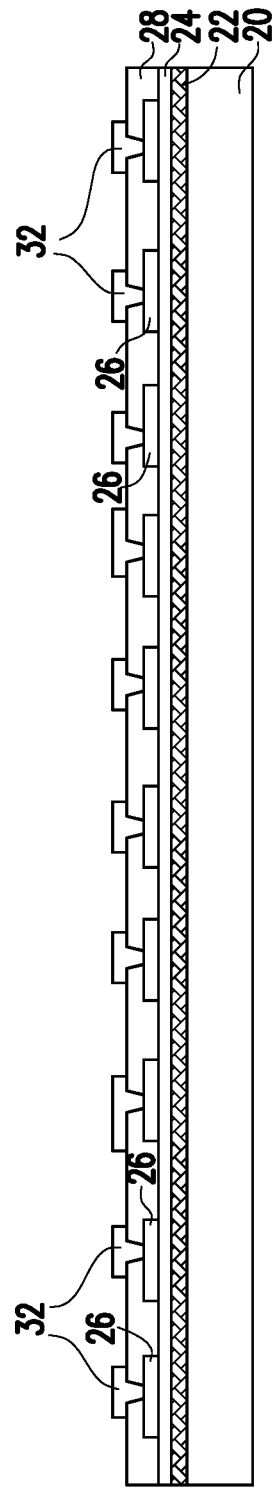
Figure 39:
FIG. 39 illustrates a process flow for forming a package in accordance with some embodiments.

Next, referring to FIG. 2, RDLs 32 are formed to connect to RDLs 26. RDLs 32 include metal traces (metal lines) over dielectric layer 28. RDLs 32 also include vias extending into the openings in dielectric layer 28. RDLs 32 are also formed in a plating process, wherein each of RDLs 32 includes a seed layer (not shown) and a plated metallic material over the seed layer. The seed layer and the plated material may be formed of the same material or different materials. RDLs 32 may include a metal or a metal alloy including aluminum, copper, tungsten, or alloys thereof. The steps for forming dielectric layers 28 and 34 and RDLs 32 and 36 are represented as step 302 in the process flow 300 as shown in FIG. 39.

Referring to FIG. 3, dielectric layer 34 is formed over RDLs 32 and dielectric layer 28. Dielectric layer 34 may be formed of an inorganic material, which may be selected from silicon oxide, silicon nitride, silicon carbo-nitride, silicon oxynitride, or the like.

FIG. 3 further illustrates the formation of RDLs 36, which are electrically connected to RDLs 32. The formation of RDLs 36 may adopt the methods and materials similar to those for forming RDLs 32. It is appreciated that although in the illustrative exemplary embodiments, two dielectric layers 28 and 34 and the respective RDLs 32 and 36 formed therein are discussed, fewer or more dielectric layers may be adopted, depending on the routing requirement and the requirement of using polymers for buffering stress. For example, there may be a single dielectric layer or three, four, or more dielectric layers.

FIG. 4 illustrates the formation of passivation layers 38 and 42 and RDLs 40 and 44. The respective step is illustrated as step 304 in the process flow 300 as shown in FIG. 39. In accordance with some embodiments of the present disclosure, passivation layers 38 and 42 are formed of inorganic materials such as silicon oxide, silicon nitride, silicon carbo-nitride, silicon oxynitride, silicon oxy-carbo-nitride, Un-doped Silicate Glass (USG), or multiplayers thereof. Each of passivation layers 38 and 42 may be a single layer or a composite layer, and may be formed of a non-porous material. In accordance with some embodiments of the present disclosure, one or both of passivation layers 38 and 42 is a composite layer including a silicon oxide layer (not shown separately), and a silicon nitride layer (not shown separately) over the silicon oxide layer. Passivation layers 38 and 42 have the function of blocking moisture and detrimental chemicals from accessing the conductive features such as fine-pitch RDLs in the package, as will be discussed in subsequent paragraphs.

Figure 11:
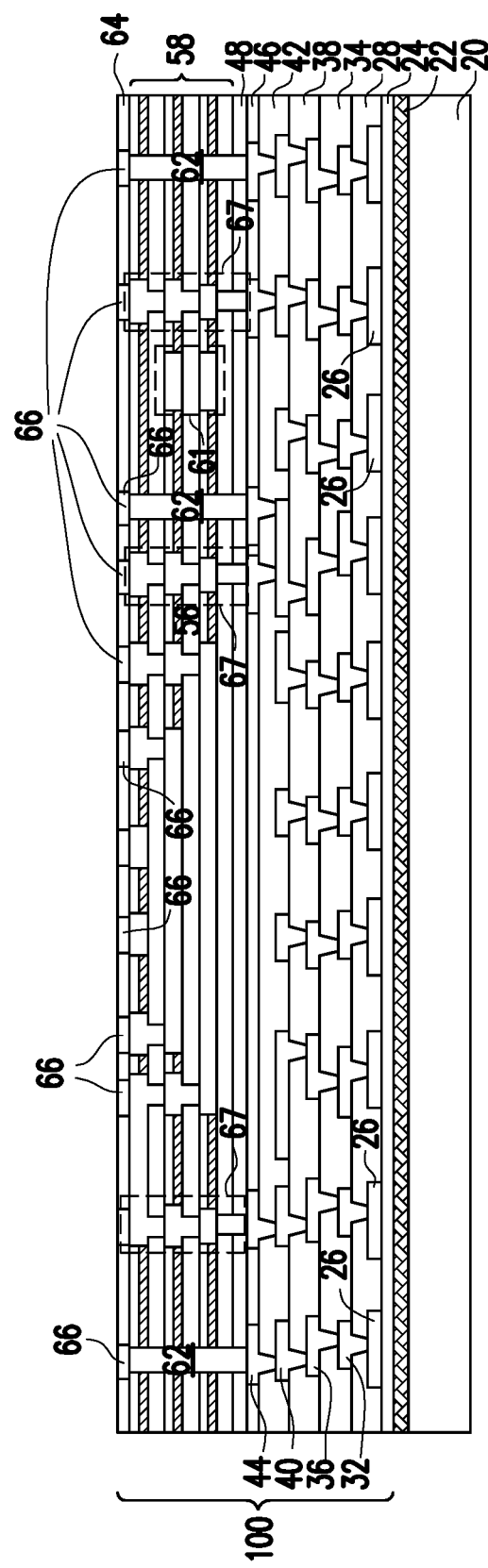

RDLs 40 and 44 may be formed of aluminum, copper, aluminum copper, nickel, or alloys thereof. In accordance with some embodiments of the present disclosure, some portions of RDLs 44 are formed as metal pads that are large enough for landing the subsequently formed Through-Dielectric Vias (TDVs), as shown in FIG. 11. These metal pads are accordingly referred to as metal pads 44 or aluminum pads 44 in accordance with some embodiments. Also, the number of passivation layers may be any integer number such as one, two (as illustrated), three, or more.

Figure 5:
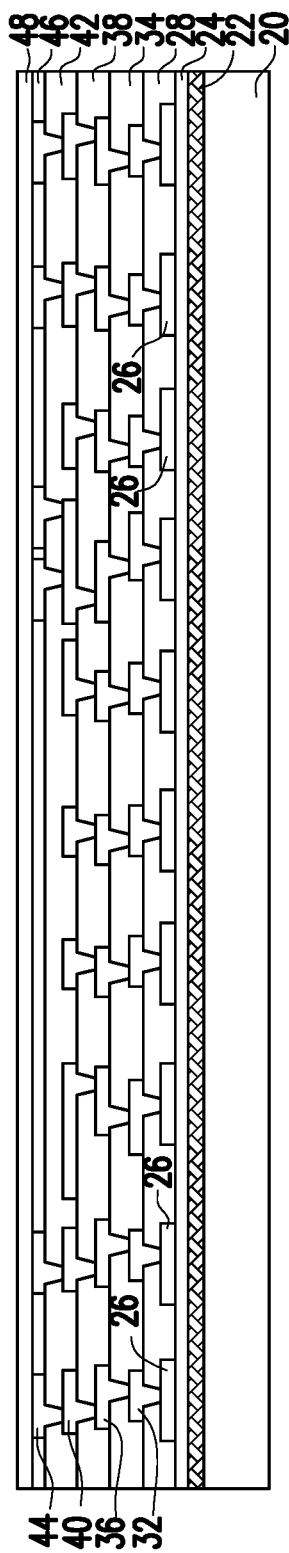

FIG. 5 illustrates the formation of one or a plurality of dielectric layers. For example, as illustrated, dielectric layer 46 may be formed to embed the top RDLs 44 therein. Dielectric layer 48 is formed over dielectric layer 46, and may act as an etch stop layer. In accordance with some embodiments of the present disclosure, dielectric layers 46 and 48 can also be replaced with a single dielectric layer. The available materials of dielectric layers 46 and 48 include silicon oxide, silicon nitride, silicon carbide, silicon oxynitride, or the like.

Figure 6:
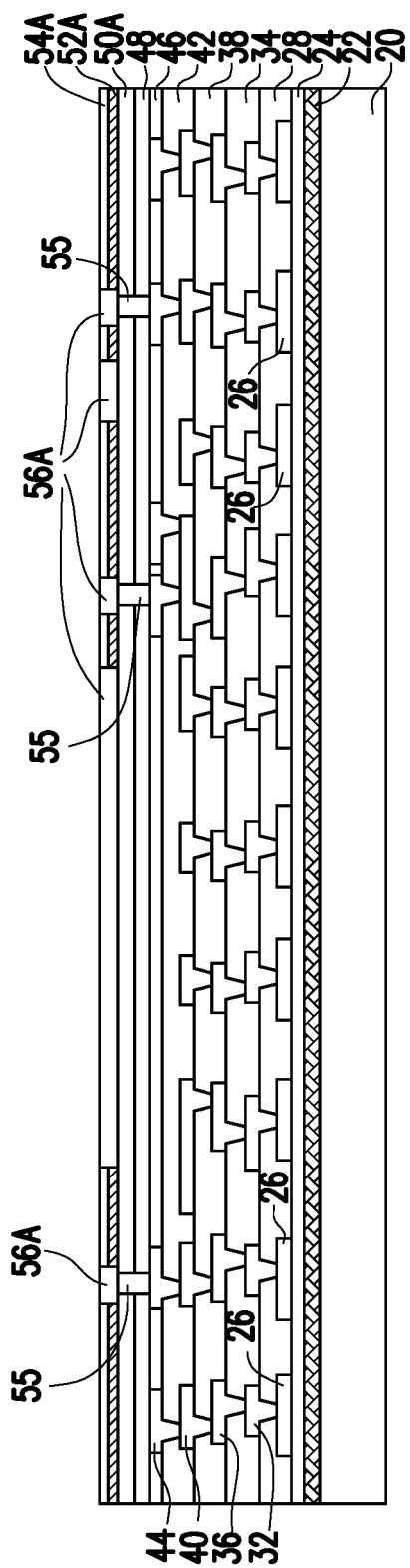

FIGS. 6, 7, and 8 illustrate the formation of dielectric layers and fine-pitch RDLs in accordance with some embodiments of the present disclosure. The respective step is illustrated as step 306 in the process flow 300 as shown in FIG. 39. The formation methods may adopt the method for forming interconnect structure for device dies based on silicon substrates. For example, the formation methods of the interconnect structure may include single damascene and/or dual damascene processes. Accordingly, the resulting RDLs are also alternatively referred to as metal lines and vias, and the corresponding dielectric layers are alternatively referred to as Inter-Metal-Dielectric (IMD) layers.

Referring to FIG. 6, vias 55, dielectric layers 50A and 54A, and etch stop layer 52A are formed. Dielectric layers 50A and 54A may be formed of silicon oxide, silicon oxynitride, silicon nitride, or the like, or low-k dielectric materials having k values lower than about 3.0. The low-k dielectric materials may include Black Diamond (a registered trademark of Applied Materials), a carbon-containing low-k dielectric material, Hydrogen SilsesQuioxane (HSQ), MethylSilsesQuioxane (MSQ), or the like. Etch stop layer 52A is formed of a material having a high etching selectivity relative to dielectric layers 50A and 54A, and may be formed of silicon carbide, silicon carbo-nitride, etc. In accordance with alternative embodiments, etch stop layer 52A is not formed.

Fine-pitch RDLs 56A are formed in dielectric layers 52A and 54A for routing. Although vias 55 and fine-pitch RDLs 56A are illustrated as having single damascene structures in some exemplary embodiments, vias 55 and fine-pitch RDLs 56A in combination may have dual damascene structures. It is appreciated that the single illustrated fine-pitch RDLs 56A represent a plurality of fine-pitch RDLs. Since the fine-pitch RDLs in accordance with some embodiments of the present disclosure are formed using damascene processes, it can be formed very thin with pitches (viewed from the top of the structure) smaller than, for example, 0.8 µm. Also, since dielectric layers 34, 38, 42, 46, and 48 may all be formed of inorganic materials, the pitches and the widths of the fine-pitch RDLs can be small. The pitches and the widths of the fine-pitch RDLs can be further reduced if dielectric layer 28 is also formed of inorganic material, so that there is no polymer layer underlying the dual damascene structure. This significantly improves the density of the fine-pitch RDLs and the routing ability. In accordance with some embodiments of the present disclosure in which vias 55 and fine-pitch RDLs 56A are formed using a dual damascene process, the formation process includes etching dielectric layers 48 and 50A to form vias openings, and dielectric layers 50A and 52A to form trenches, filling the via openings and the trenches with a conductive material(s), and performing a planarization such as Chemical Mechanical Polish (CMP) or mechanical grinding to remove the portions the conductive material over dielectric layers.

In accordance with some embodiments of the present disclosure, the conductive material for forming vias 55 and fine-pitch RDLs 56A is a homogenous material. In accordance with other embodiments of the present disclosure, the conductive material is a composite material including a barrier layer formed of titanium, titanium nitride, tantalum, tantalum nitride, or the like, and a copper-containing material (which may be copper or copper alloy) over the barrier layer.

FIG. 7 illustrates the formation of dielectric layers 50B and 54B and etch stop layer 52B. The materials of dielectric layers 50B and 54B may be selected from the same candidate materials for forming dielectric layers 50A and 54A, and the material of etch stop layer 52B may be selected from the same candidate materials for forming etch stop layer 52A.

Fine-pitch RDLs 56B are also formed in dielectric layers 50B, 52B, and 54B. Fine-pitch RDLs 56B include metal lines formed in dielectric layers 54B and 52B and vias in dielectric layer 50B. The formation may include a dual damascene process, which includes forming trenches in dielectric layers 54B and 52B and via openings in dielectric layer 50B, filling a conductive material(s), and then performing a planarization such as mechanical grinding or Chemical Mechanical Polish (CMP). Similarly, fine-pitch RDLs 56B may be formed of a homogenous material, or may be formed of a composite material including a barrier layer and a copper-containing material over the barrier layer.

FIG. 8 illustrates the formation of dielectric layers 50C and 54C, etch stop layer 52C, and fine-pitch RDLs 56C. The formation method and the materials may be similar to the underlying respective layers, and hence are not repeated herein. Also, etch stop layers 52A, 52B, and 52C may be omitted in accordance with some embodiments of the present disclosure, and the corresponding etching for forming trenches may be performed using a time-mode to control the depths of the trenches. It is appreciated that there may be more dielectric layers and layers of fine-pitch RDLs formed. In addition, even if some or all of etch stop layers 52A, 52B, and 52C may be skipped, since the dielectric layers in which the fine-pitch RDLs are located are formed in different processes, there may be distinguishable interfaces between the dielectric layers for forming fine-pitch RDLs 56A, 56B, and 56C, regardless of whether these dielectric layers are formed of the same dielectric material or different dielectric materials. In subsequent paragraphs, dielectric layers 50A, 52A, 54A, 50B, 52B, 54B, 50C, 52C, and 54C are collectively and individually referred to as dielectric layers 58 for the simplicity in identification. Fine-pitch RDLs 56A, 56B, and 56C are also collectively and individually referred to as fine-pitch RDLs 56.

In accordance with some embodiments of the present disclosure, passive device 61 is formed at the same time when fine-pitch RDLs 56 are formed. Passive device 61 is thus embedded in dielectric layers 58. Passive device 61 may be a capacitor, an inductor, a Radio-Frequency (RF) transmission line, a transformer, or the combinations of these devices. Passive device 61 is electrically coupled to the subsequently bonded device dies.

Figure 10:
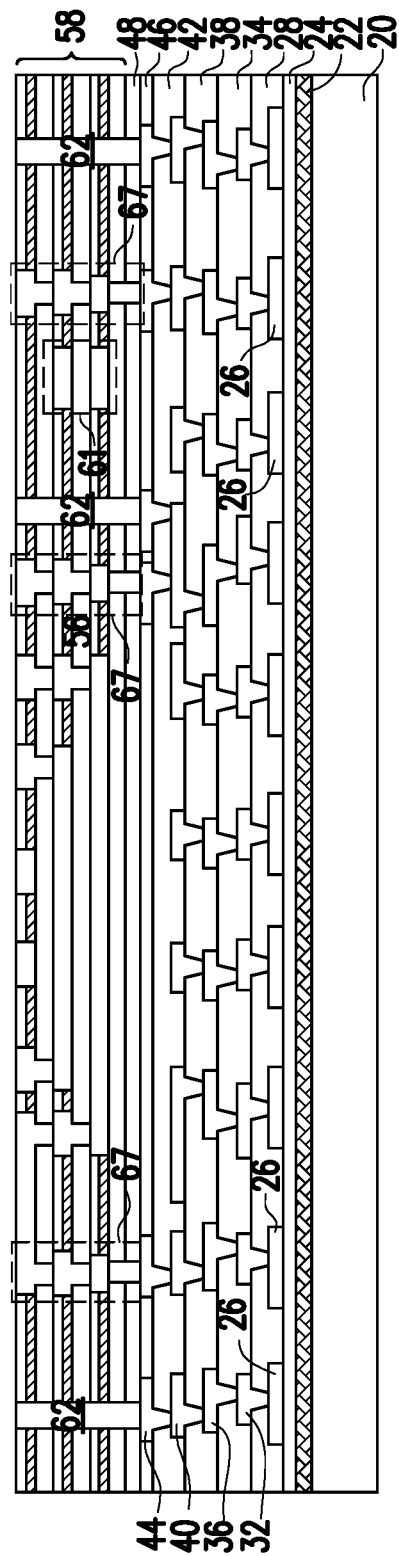

Also, at the same time fine-pitch RDLs 56 are formed, stacked vias 67 are also formed, with each including a plurality of dual damascene structures (and may or may not include single damascene structures) stacked to form a connection structure penetrating through dielectric layers 58. Stacked vias 67 in combination have similar functions as that of Through-Dielectric Vias (TDVs) 62 as shown in FIG. 10. It is beneficial to form stacked vias since they are formed using dual damascene process, and hence may have widths as small as a metal line in the dual damascene structure.

Stacked vias 67 may also be used for routing. For example, portion 56D in RDLs 56 is schematically illustrated to show that metal lines may be formed simultaneously as stacked vias 67 for routing purpose. Stacked vias 67 may thus be electrically connected sideways to other electrical components. The routing metal lines may be formed in any of the metal layers of fine-pitch RDLs 56.

Figure 9:
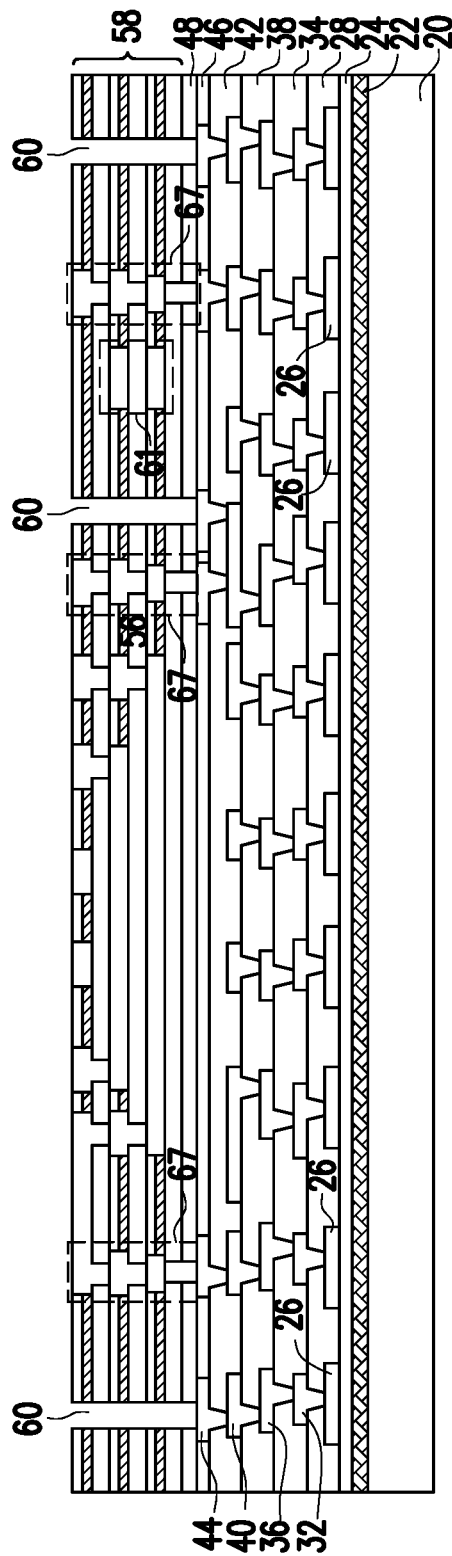

Referring to FIG. 9, dielectric layers 48 and 58 are etched to form Through-Dielectric Via (TDV) openings 60. The respective step is illustrated as step 308 in the process flow 300 as shown in FIG. 39. Metal pads 44 are exposed to TDV openings 60. The top-view shapes of via openings 60 may be rectangles, circles, hexagons, or the like.

Next, TDV openings 60 are filled with a conductive material(s) to form TDVs 62, and the resulting structure is shown in FIG. 10. The respective step is illustrated as step 310 in the process flow 300 as shown in FIG. 39. In accordance with some embodiments of the present disclosure, TDVs 62 are formed of a homogenous conductive material, which may be a metal or a metal alloy including copper, aluminum, tungsten, or the like. In accordance with alternative embodiments of the present disclosure, TDVs 62 have a composite structure including a conductive barrier layer formed of titanium, titanium nitride, tantalum, tantalum nitride, or the like, and a metal-containing material over the barrier layer. In accordance with some embodiments of the present disclosure, a dielectric isolation layer is formed to encircle each of TDVs 62. In accordance with alternative embodiments, no dielectric isolation layers are formed to encircle TDVs 62, and TDVs 62 are in physical contact with dielectric layers 58. The formation of TDVs 62 also include depositing the conductive material into the TDV openings 60 (FIG. 9), and performing a planarization to remove excess portions of the deposited material over dielectric layers 58. TDVs 62 may have greater widths than stacked vias 67 due to the difficulty in forming deep openings 60 (FIG. 9) penetrating through the plurality of dielectric layers 58 and 48, which have different etching properties. The resistance of TDVs 62 is low. Accordingly, TDVs 62 may be used for conducting power while the area occupied by TDVs 62 is not significant due to the small number of TDVs 62. Combining stacked vias 67 and TDVs 62 may increase the number of signal connections (using stacked vias 67), while can still serve low-loss power transmission using wide TDVs 62. In accordance with some embodiments, TDVs 62 are not formed.

FIG. 11 illustrates the formation of bond pads 66 and dielectric layer 64, and bond pads 66 are located in dielectric layer 64. The respective step is illustrated as step 312 in the process flow 300 as shown in FIG. 39. Bond pads 66 may be formed of a metal that is easy for forming hybrid bonding. In accordance with some embodiments of the present disclosure, bond pads 66 are formed of copper or a copper alloy. Dielectric layer 64 may be formed of silicon oxide, for example. The top surfaces of bond pads 66 and dielectric layer 64 are coplanar. The planarity may be achieved, for example, through a planarization step such as a CMP or a mechanical grinding step.

In accordance with some embodiments of the present disclosure, bond pads 66 and dielectric layer 64 are not formed. Accordingly, device dies 68A and 68B are bonded to the top RDLs 56 (shown as 56C in FIG. 8) and possibly dielectric layer 54C (FIG. 8) directly.

Throughout the description, the components over layer 22 (or silicon wafer 23) are in combination referred to as interposer 100. Interposer 100, different from conventional interposers that were formed based on silicon substrates, are formed based on dielectric layers 58. No silicon substrate is in interposer 100, and hence interposer 100 is referred to as a silicon-substrate-free interposer or a Si-less interposer. Stacked vias 67 and TDVs 62 are formed in dielectric layers 58 to replace conventional through-silicon vias. Since silicon substrates are semiconductive, it may adversely affect the performance of the circuits and the connections formed therein and thereon. For example, signal degradation may be caused by the silicon substrate, and such degradation may be avoided in the embodiments of the present disclosure since the TDVs 62 and stacked vias 67 are formed in dielectric layers.

Figure 12:
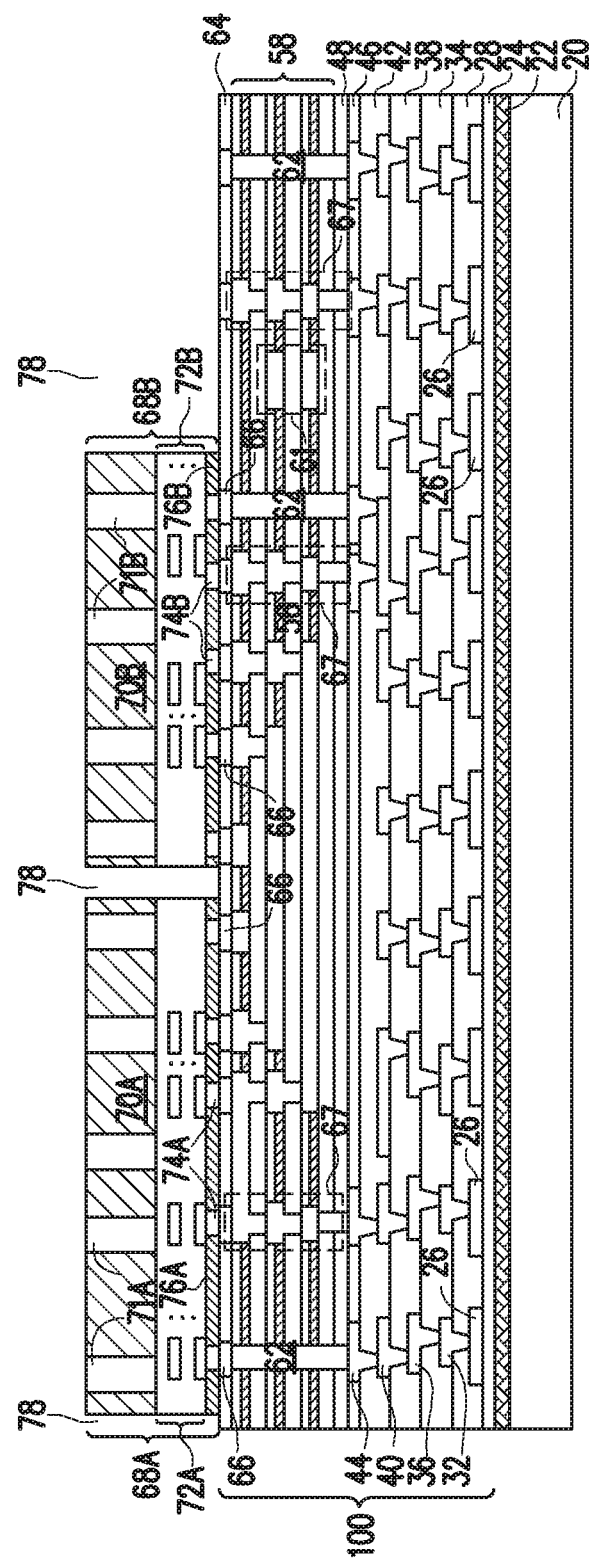

Next, first-layer device dies 68A and 68B are bonded to interposer 100, as shown in FIG. 12. The respective step is illustrated as step 314 in the process flow 300 as shown in FIG. 39. In accordance with some embodiments of the present disclosure, device dies 68A and 68B include a logic die, which may be a Central Processing Unit (CPU) die, a Micro Control Unit (MCU) die, an input-output (IO) die, a BaseBand (BB) die, or an Application processor (AP) die. Device dies 68A and 68B may also include a memory die. Device dies 68A and 68B include semiconductor substrates 70A and 70B, respectively, which may be silicon substrates. Through-Silicon Vias (TSVs) 71A and 71B, sometimes referred to as through-semiconductor vias or through-vias, are formed to penetrate through semiconductor substrates 70A and 70B, respectively, and are used to connect the devices and metal lines formed on the front side (the illustrated bottom side) of semiconductor substrates 70A and 70B to the backside. Also, device dies 68A and 68B include interconnect structures 72A and 72B, respectively, for connecting to the active devices and passive devices in device dies 68A and 68B. Interconnect structures 72A and 72B include metal lines and vias (not shown).

Device die 68A includes bond pads 74A and dielectric layer 76A at the illustrated bottom surface of device die 68A. The illustrated bottom surfaces of bond pads 74A are coplanar with the illustrated bottom surface of dielectric layer 76A. Device die 68B includes bond pads 74B and dielectric layer 76B at the illustrated bottom surface. The illustrated bottom surfaces of bond pads 74B are coplanar with the illustrated bottom surface of dielectric layer 76B.

The bonding may be achieved through hybrid bonding. For example, bond pads 74A and 74B are bonded to bond pads 66 through metal-to-metal direct bonding. In accordance with some embodiments of the present disclosure, the metal-to-metal direct bonding is copper-to-copper direct bonding. Furthermore, dielectric layers 76A and 76B are bonded to dielectric layer 64, for example, with Si—O—Si bonds generated. The hybrid bonding may include a pre-bonding and an anneal, so that the metals in bond pads 74A (and 74B) inter-diffuse with the metals in the respective underlying bond pads 66.

Fine-pitch RDLs 56 electrically interconnect bond pads 74A and bond pads 74B, and are used for the signal communication between device dies 68A and 68B. Fine-pitch RDLs 56 have small pitches and small widths. Accordingly, the density of fine-pitch RDLs 56 is high, and hence enough communication channels may be formed for the direct communication between device dies 68A and 68B. On the other hand, TDVs 62 and stacked vias 67 provide direct connection from device dies 68A and 68B to the component (which may be a package substrate, a Printed Circuit Board (PCB), or the like) that will be bonded to interposer 100. Furthermore, the bonding between bond pads 74A/74B and 66 are through bond pads rather than through solder joints, which are typically much larger than the bond pads. Accordingly, the horizontal sizes of the bonds are small, and more bonds can be implemented to provide enough communication channels.

Further referring to FIG. 12, a backside grinding is performed to thin device dies 68A and 68B, for example, to a thickness between about 15 μm and about 30 μm. The respective step is illustrated as step 316 in the process flow 300 as shown in FIG. 39. Through the thinning, the aspect ratio of gaps 78 between neighboring device dies 68A and 68B is reduced in order to perform gap filling. Otherwise, the gap filling is difficult due to the otherwise high aspect ratio of openings 78. After the backside grinding, TSVs 71A and 71B may be revealed. Alternatively, TSVs 71A and 71B are not revealed at this time. Instead, TSVs 71A and 71B may be revealed in the step shown in FIG. 17.

Figure 13:
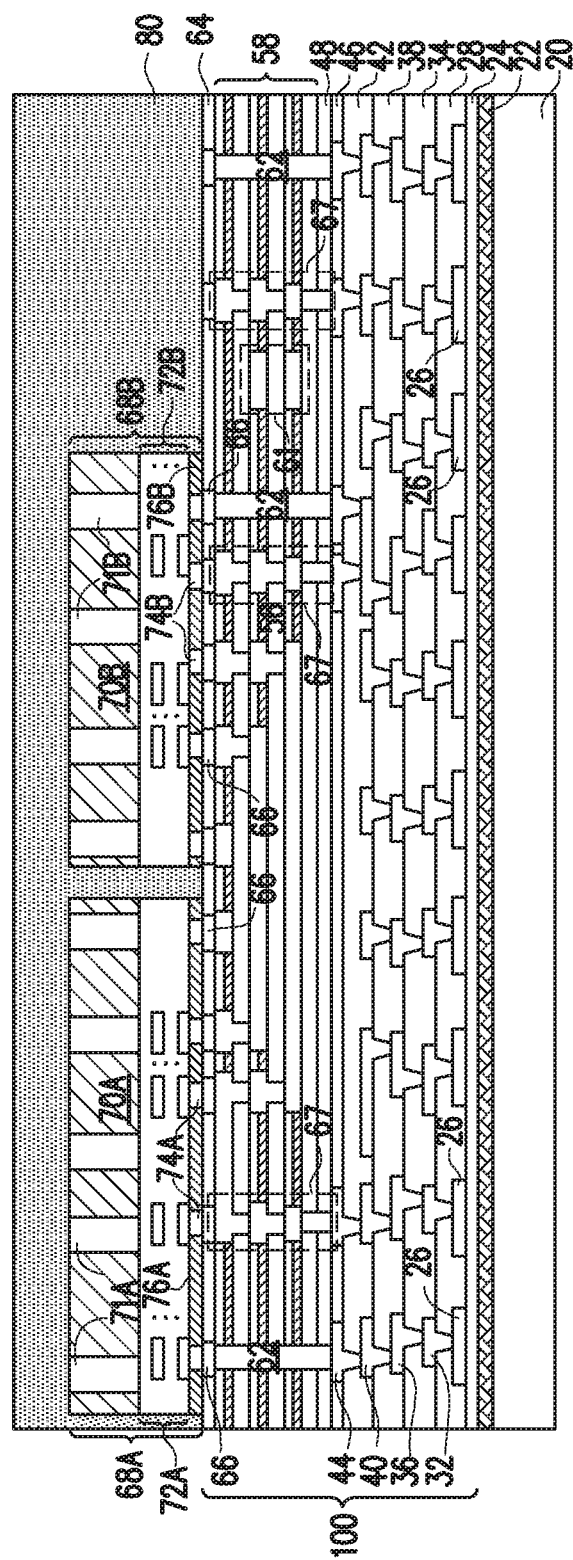
Figure 14:
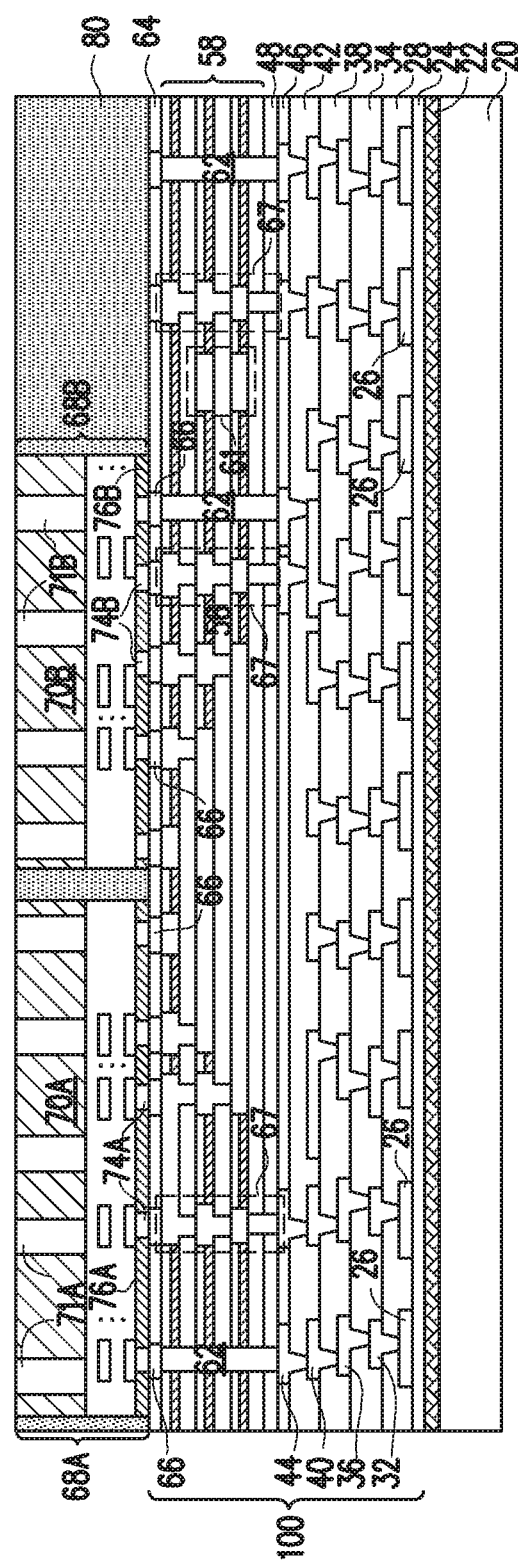

Next, gaps 78 are filled by gap-filling material 80, as shown in FIG. 13. The respective step is illustrated as step 318 in the process flow 300 as shown in FIG. 39. In accordance with some embodiments of the present disclosure, gap-filling material 80 includes an oxide such as silicon oxide, which may be formed using tetraethyl orthosilicate (TEOS). The formation method may include Chemical Vapor Deposition (CVD), High-Density Plasma Chemical Vapor Deposition (HDPCVD), or the like. In accordance with alternative embodiments, gap-filling material 80 is formed of a polymer such as PBO, polyimide, or the like. A planarization step is then performed to remove excess portions of gap-filling material 80, so that substrates 70A and 70B of device dies 68A and 68B are revealed. The resulting structure is shown in FIG. 14.

Figure 15:
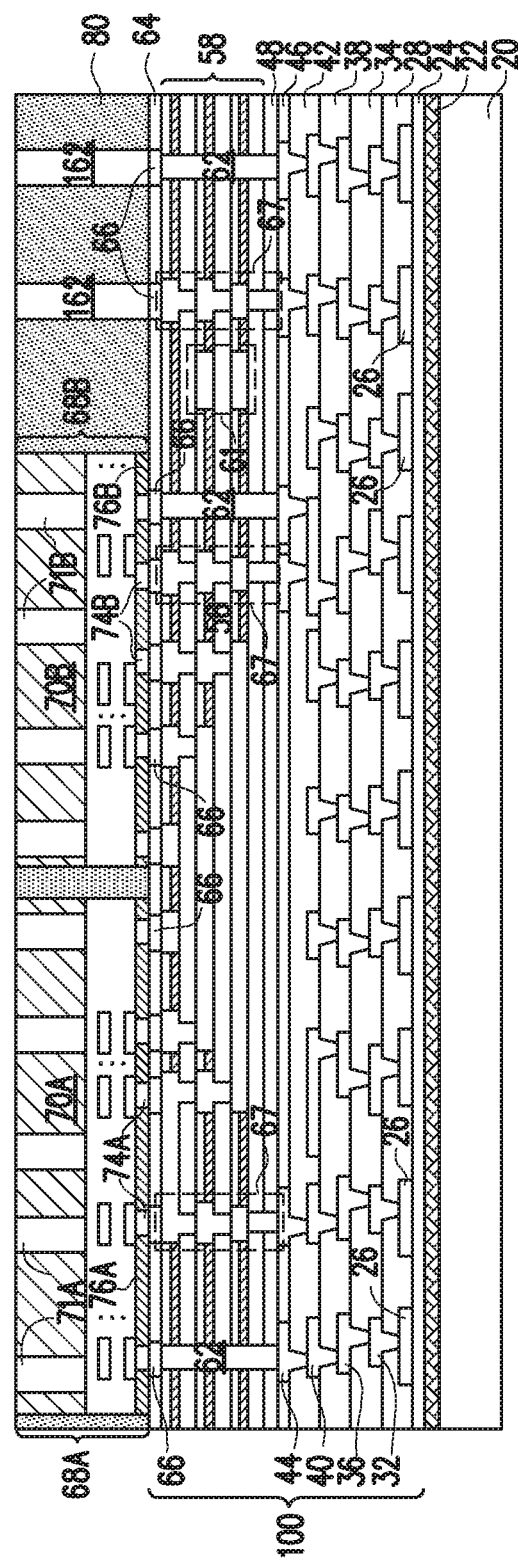

FIG. 15 illustrates the formation of TDVs 162, which are formed by etching-through gap-filling material 80 in an anisotropic etching step to form via openings, and filling the respective openings with a conductive material(s). The respective step is illustrated as step 320 in the process flow 300 as shown in FIG. 39. Some bond pads 66 are exposed to the via openings, wherein the etching may be performed using bond pads 66 as etch stop layers. TDVs 162 may have a structure similar to the structure of TDVs 62, and may include barrier layers and a metallic material over the barrier layers. The materials of TDVs 162 may also be selected from the similar candidate materials for forming TDVs 62.

Figure 16:
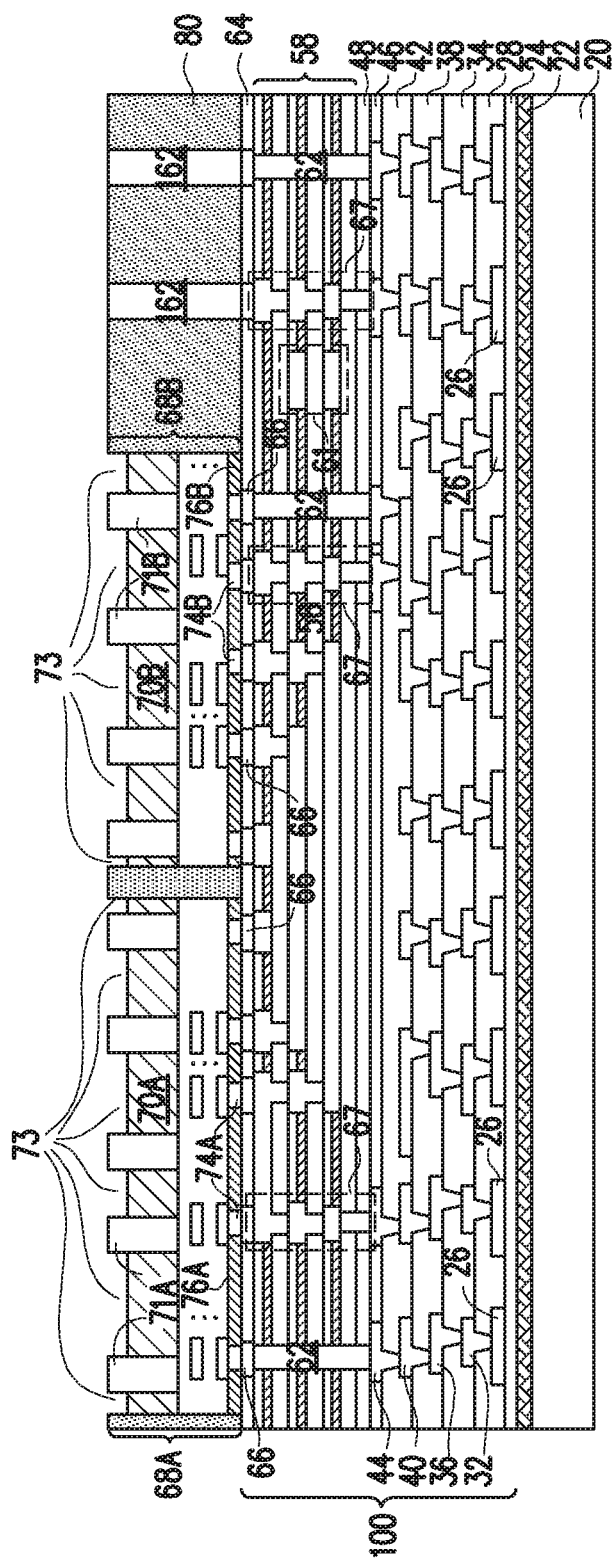
Figure 17:
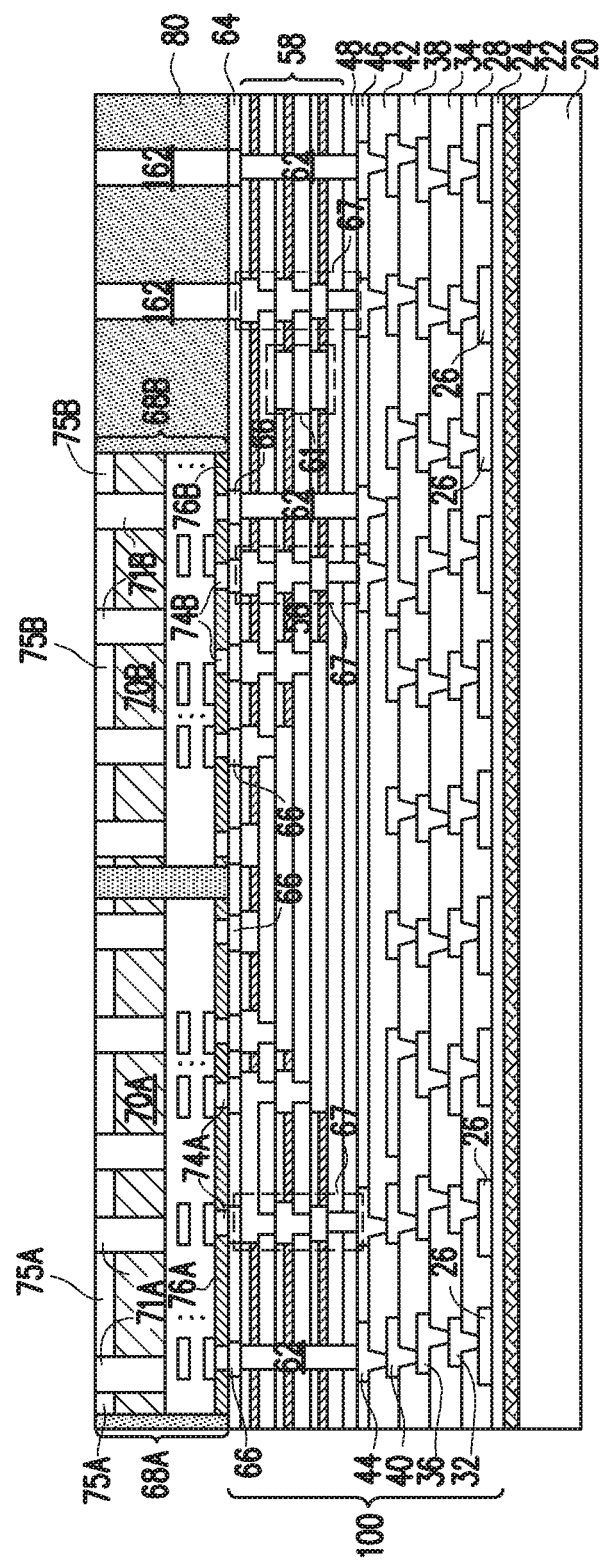

Referring to FIG. 16, substrates 70A and 70B are recessed to form recesses 73, and the top ends of TSVs 71A and 71B protrude slightly above the top surfaces of substrates 70A and 70B, respectively. The respective step is illustrated as step 322 in the process flow 300 as shown in FIG. 39. Recesses 73 are then filled with a dielectric material such as silicon oxide to form dielectric layers 75A and 75B, and the resulting structure is shown in FIG. 17. The respective step is illustrated as step 324 in the process flow 300 as shown in FIG. 39. The formation process includes a deposition process to deposit a blanket dielectric layer, and preforming a planarization to remove portions of the blanket dielectric layer higher than the top ends of TSVs 71A and 71B.

Figure 18:
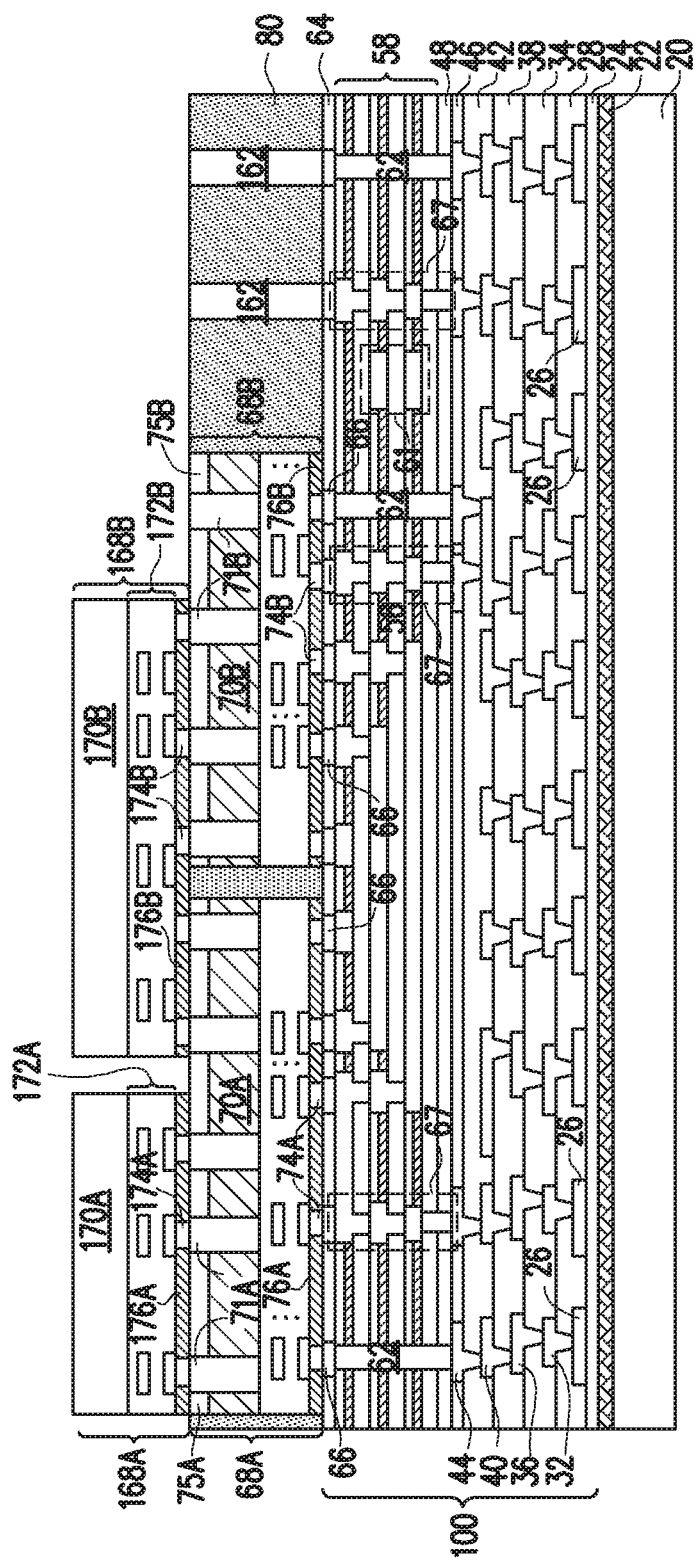

Next, second-layer device dies 168A and 168B are bonded to device dies 68A and 68B, as shown in FIG. 18. The respective step is illustrated as step 326 in the process flow 300 as shown in FIG. 39. In accordance with some embodiments of the present disclosure, device dies 168A and 168B include logic dies, memory dies, or combinations thereof. Device dies 168A and 168B include semiconductor substrates 170A and 170B, respectively, which may be semiconductor substrates such as silicon substrates. TSVs (not shown) may be formed in semiconductor substrates 170A and 170B if there are third-layer device dies bonded over device dies 168A and 168B. Alternatively, TSVs are not formed in semiconductor substrates 170A and 170B. Also, device dies 168A and 168B include interconnect structures 172A and 172B, respectively, for connecting to the active devices and passive devices in device dies 168A and 168B. Interconnect structures 172A and 172B include metal lines and vias (not shown).

Device die 168A includes bond pads 174A and dielectric layer 176A at the illustrated bottom surface of device die 168A. The illustrated bottom surfaces of bond pads 174A are coplanar with the illustrated bottom surface of dielectric layer 176A. Device die 168B includes bond pads 174B and dielectric layer 176B at the illustrated bottom surface. The illustrated bottom surfaces of bond pads 174B are coplanar with the illustrated bottom surface of dielectric layer 176B.

The bonding may be achieved through hybrid bonding. For example, bond pads 174A and 174B are directly bonded to TSVs 71A and 71B through metal-to-metal direct bonding. In accordance with some embodiments of the present disclosure, the metal-to-metal direct bonding is copper-to-copper direct bonding. Furthermore, dielectric layers 176A and 176B are bonded to dielectric layers 75A and 75B, for example, with Si—O—Si bonds generated. Depending on the material of gap-filling material 80, dielectric layers 176A and 176B may be bonded to gap-filling material 80, or may be in contact with, but not bonded to (no bonds are formed), gap-filling material 80.

Figure 19:
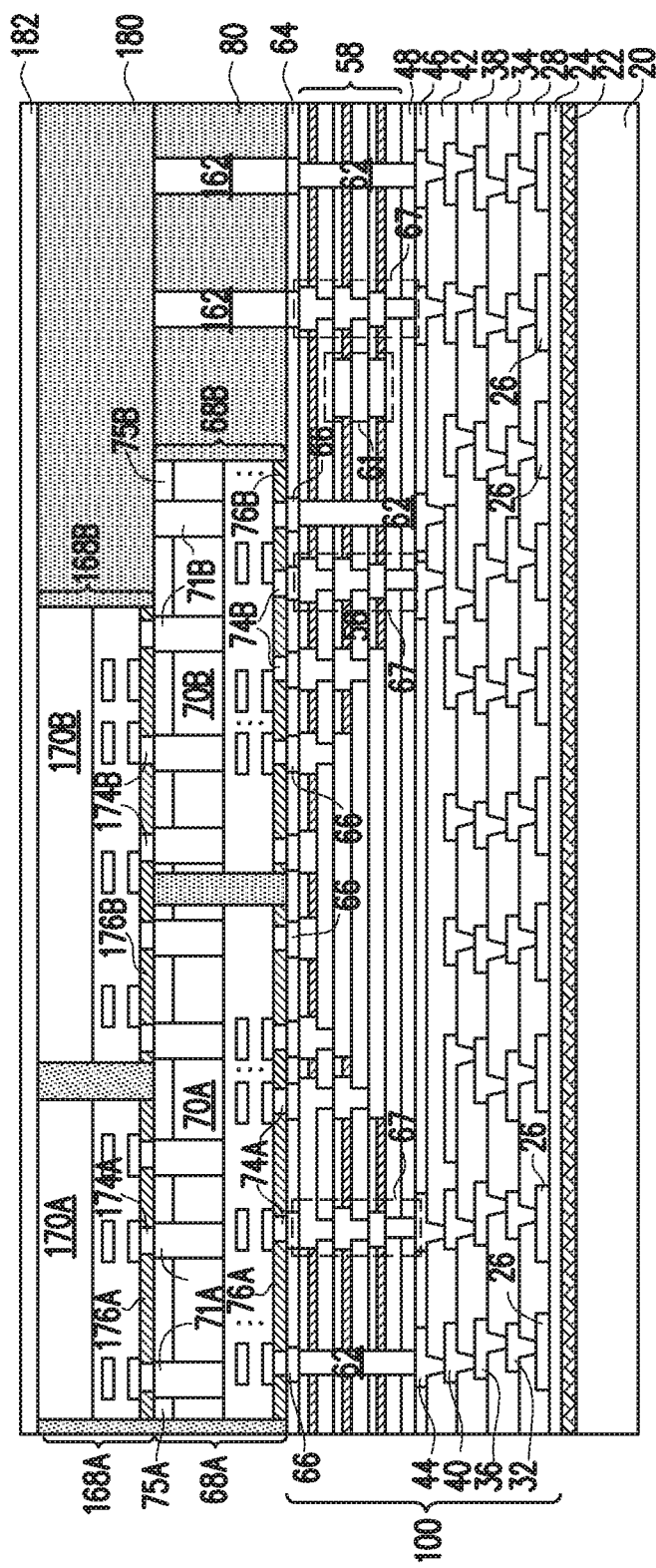

Next, device dies 168A and 168B may be thinned, similar to the thinning of device dies 68A and 68B. The gaps between neighboring device dies 168A and 168B are then filled by gap-filling material 180, as shown in FIG. 19. The respective step is illustrated as step 328 in the process flow 300 as shown in FIG. 39. In accordance with some embodiments of the present disclosure, gap-filling material 180 is formed using a method selected from the same candidate methods for forming gap-filling material 80. Gap-filling material 180 may include an oxide such as silicon oxide, silicon nitride, PBO, polyimide, or the like. A planarization step is then performed to remove excess portions of gap-filling material 180, so that substrates 170A and 170B of device dies 168A and 168B are revealed.

Dielectric layer 182 is then deposited as a blanket layer, for example, using CVD, PECVD, ALD, or the like. The resulting structure is also shown in FIG. 19. The respective step is illustrated as step 330 in the process flow 300 as shown in FIG. 39. In accordance with some embodiments of the present disclosure, dielectric layer 182 is formed of an oxide such as silicon oxide, silicon oxynitride, or the like.

Figure 20:
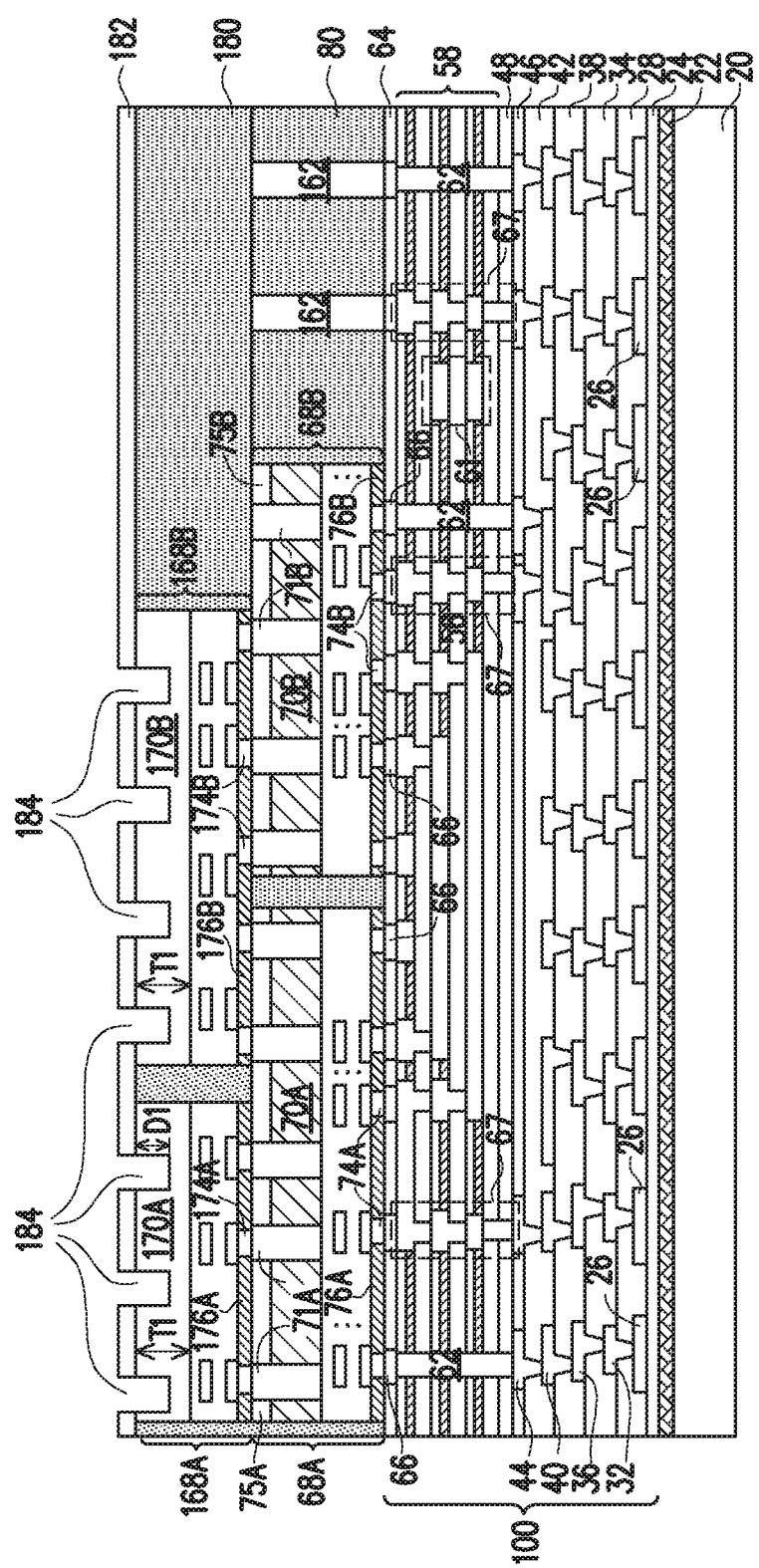

Next, referring to FIG. 20, trenches 184 are formed by etching dielectric layer 182 and substrates 170A and 170B, so that trenches 184 extend into dielectric layer 182 and substrates 170A and 170B. Depth D1 of the portions of trenches 184 inside substrates 170A and 170B may be greater than about 1 µm, and may be between about 2 µm and about 5 µm, depending on the thickness T1 of substrates 170A and 170B. For example, depth D1 may be between about 20 percent and about 60 percent of thickness T1. It is appreciated that the values recited throughout the description are examples, and may be changed to different values.

Trenches 184 may be distributed in various patterns. For example, trenches 184 may be formed as discrete openings, which may be allocated to have a pattern of an array, a pattern of beehive, or other repeat patterns. The top-view shapes of trenches 184 may be rectangles, circles, hexagons, or the like. In accordance with alternative embodiments, trenches 184, when viewed in the top view of the structure shown in FIG. 20, may be parallel trenches that have lengthwise directions in a single direction. Trenches 84 may also be interconnected to form a grid. The grid may include a first plurality of trenches parallel to each other and evenly or unevenly spaced, and a second plurality of trenches parallel to each other and evenly or unevenly spaced. The first plurality of trenches and the second plurality of trenches intercept with each other to form the grid, and the first plurality of trenches and the second plurality of trenches may or may not be perpendicular to each other in the top view.

Figure 21:
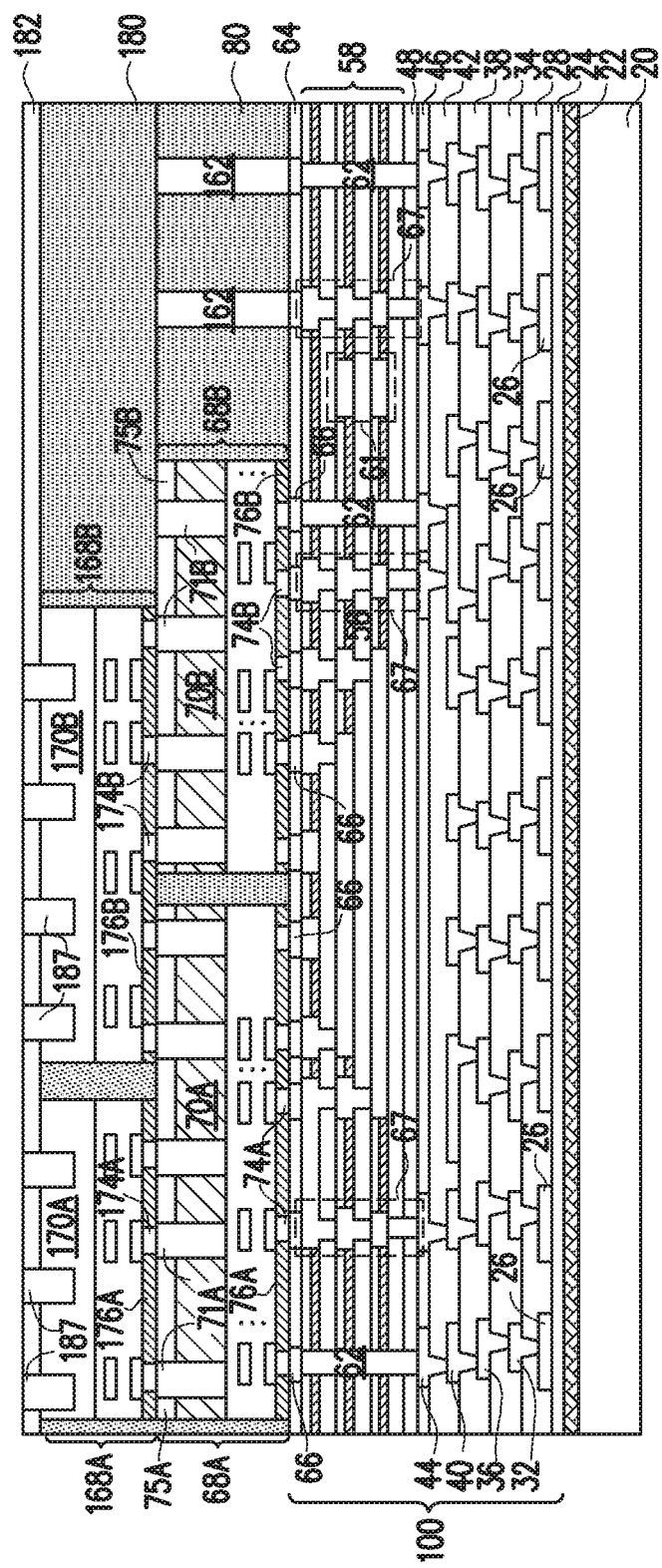

Trenches 184 are then filled to form bond pads 187, as shown in FIG. 21. The respective step is also illustrated as step 332 in the process flow 300 as shown in FIG. 39. It is appreciated that although features 187 are referred to as bond pads, features 187 may be discrete pads, interconnected metal lines, or a metal grid. In accordance with some embodiments of the present disclosure, bond pads 187 are formed of copper or other metals suitable for hybrid bonding (due to relatively easiness in diffusing). After the filling, a planarization is performed to planarize the top surfaces of bond pads 187 with the top surface of dielectric layer 182. The planarization may include a CMP or a mechanical grinding.

Figure 22:
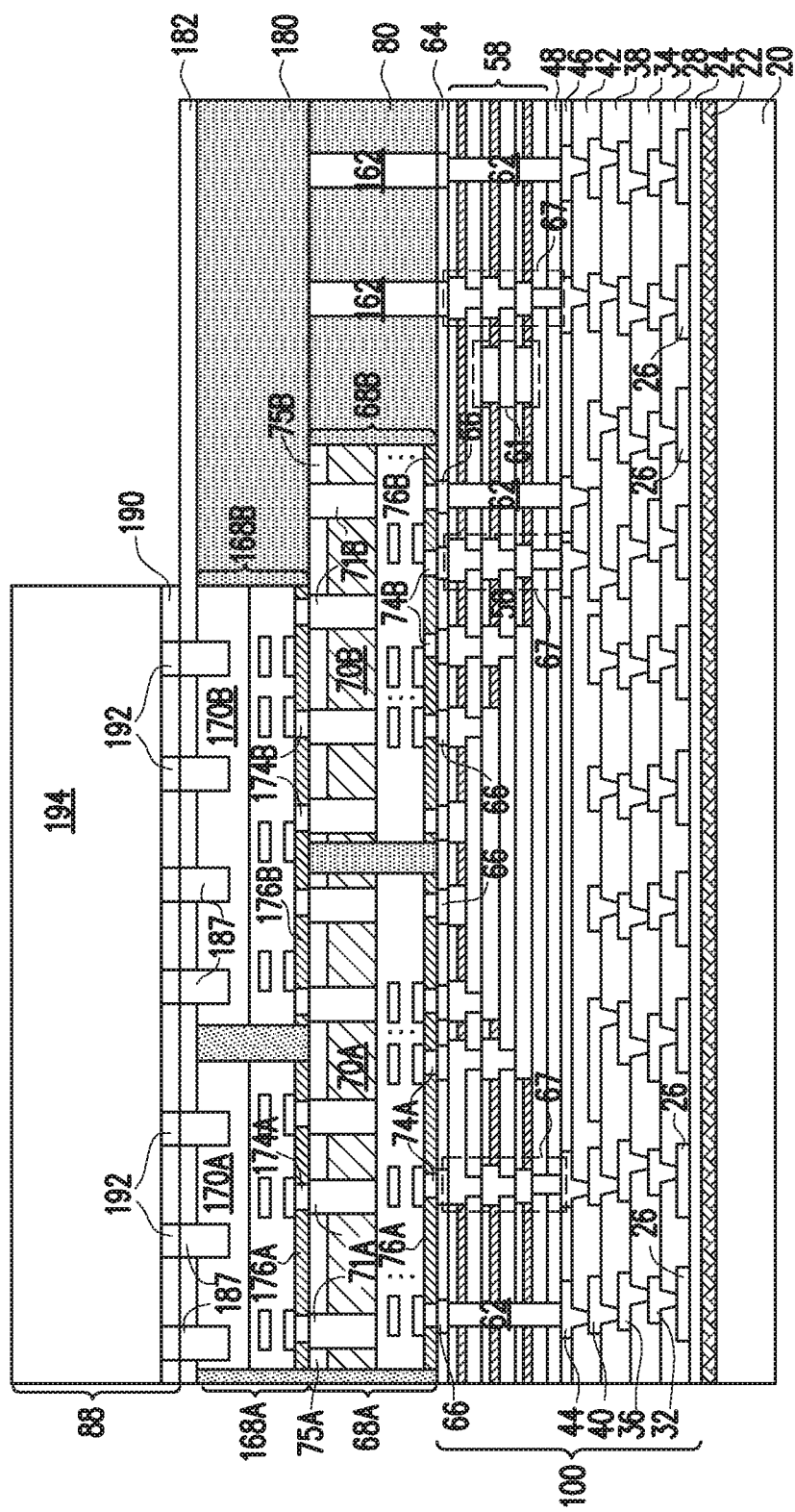

Next, as shown in FIG. 22, blank die 88 is bonded to device dies 168A and 168B. The respective step is illustrated as step 332 in the process flow 300 as shown in FIG. 39. Blank die 88 includes bulk substrate 194, which may be a silicon substrate or a metal substrate. When formed of metal, substrate 194 may be formed of copper, aluminum, stainless steel, or the like. When substrate 194 is formed of silicon, there is no active device and passive device formed in blank die 88. Blank die 88 includes two functions. First, blank die 88 provides mechanical support to the underlying structure since device dies 68A, 68B, 168A, and 168B have been thinned in order to allow for better gap filling. Also, silicon or metal (of substrate 194) has a high thermal conductivity, and hence blank die 88 may act as a heat spreader. Since the formation of the structure in FIG. 22 is at wafer-level, a plurality of blank dies identical to the illustrated blank dies 88 are also bonded to the respective underlying device dies that are identical to device dies 168A and 168B.

Dielectric layer 190 is formed at the surface of substrate 194. Dielectric layer 190 may be formed of silicon oxide or silicon oxynitride, for example. Also, bond pads 192 are formed in dielectric layer 190, and the illustrated bottom surfaces of bond pads 192 are coplanar with the illustrated bottom surface of dielectric layer 190. The pattern and the horizontal sizes of bond pads 192 may be the same as or similar to that of the respective bond pads 187, so that bond pads 192 and bond pads 187 may be bonded to each other with a one-to-one correspondence.

The bonding of blank die 88 onto device dies 168A and 168B may be achieved through hybrid bonding. For example, dielectric layers 182 and 190 are bonded to each other, and may form Si—O—Si bonds. Bond pads 192 are bonded to the respective bond pads 187 through metal-to-metal direct bonding.

Advantageously, bond pads 187, by contacting (and even being inserted into) substrates 170A and 170B, provide a good thermal dissipating path, so that the heat generated in device dies 68A, 68B, 168A and 168B can easily dissipate into bulk substrate 194, and hence bulk substrate 194 is used as a heat spreader.

Figure 23:
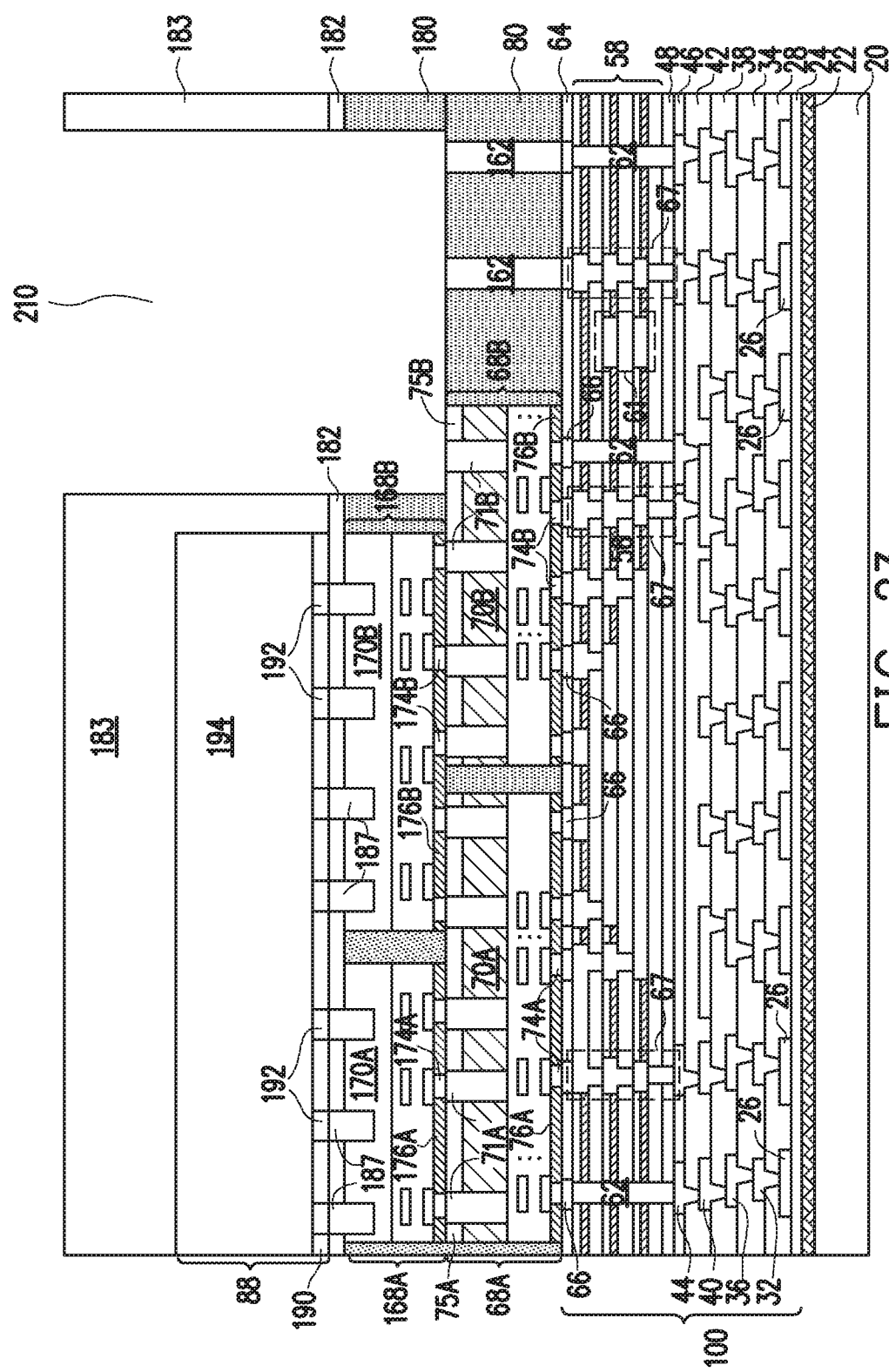

Referring to FIG. 23, photo resist 183 is applied and patterned. Dielectric layer 182 and gap-filling material 180 are then etched using the patterned photo resist 183 as an etching mask to reveal some portions of interposer 100. The respective step is illustrated as step 334 in the process flow 300 as shown in FIG. 39. In accordance with some embodiments of the present disclosure, some device dies such as device die 68B are revealed. Some of TSVs 71B and TDVs 162 may also be exposed.

Figure 24:
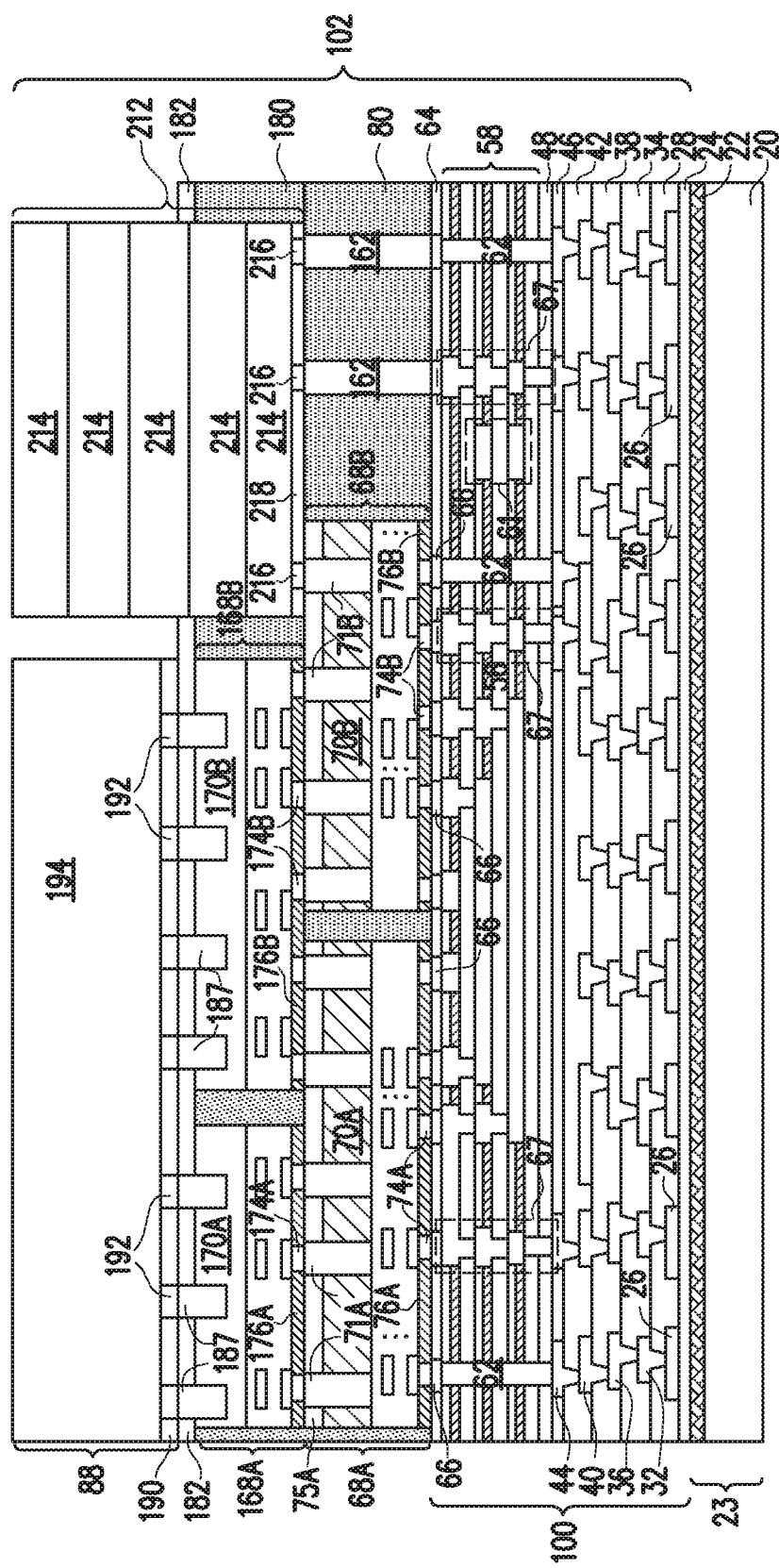
Figure 25:
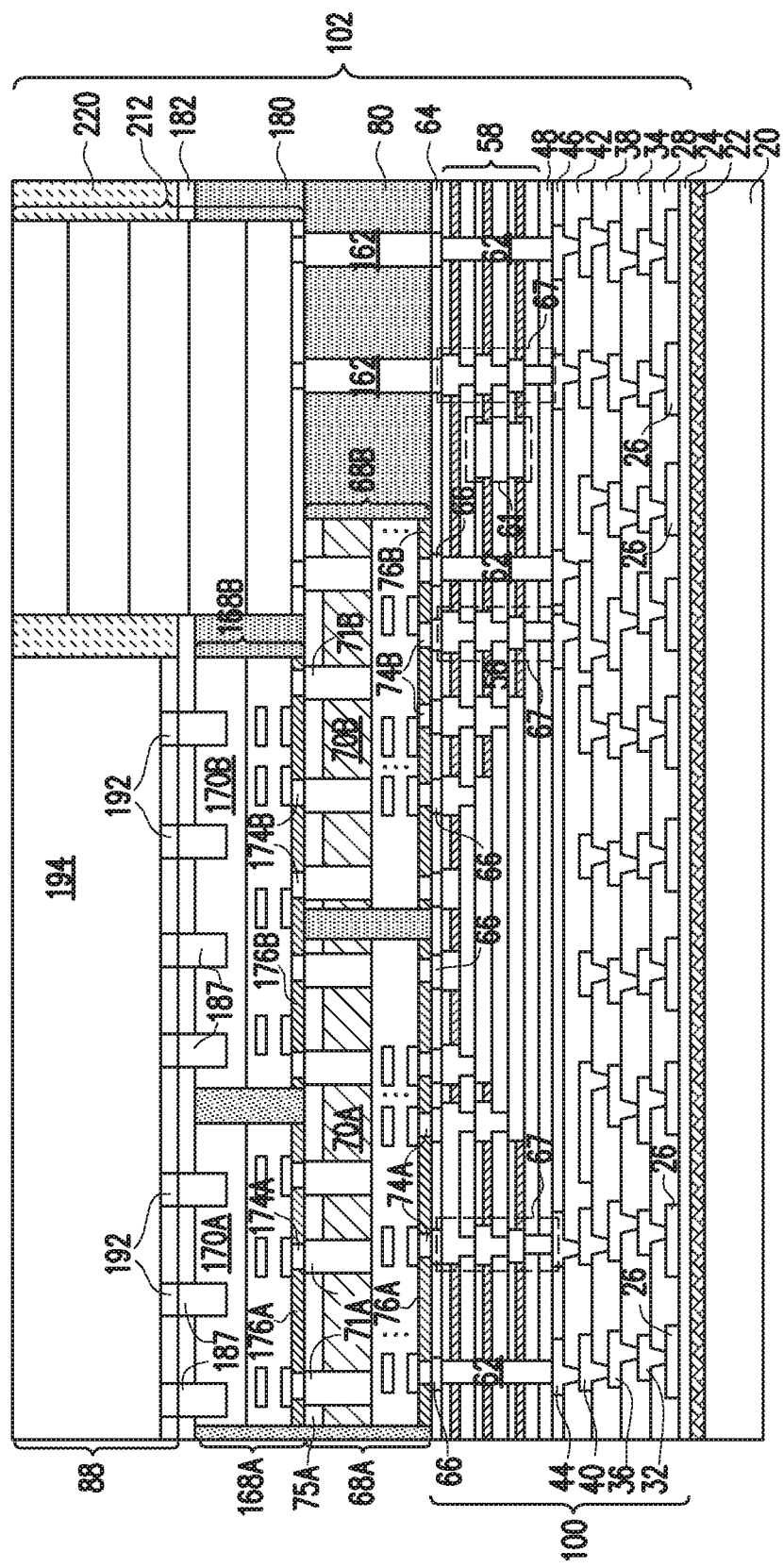

FIG. 24 illustrates the bonding of die stack 212 onto the first-layer structure. The respective step is illustrated as step 336 in the process flow 300 as shown in FIG. 39. Die stack 212 may be bonded to TDVs 162, device dies (such as die 68B), or both TDVs 162 and the device dies. Die stack 212 may be a memory stack including a plurality of stacked dies 214, wherein TSVs (not shown) may be formed in dies 214 to perform interconnection. Die stack 212 may also be a High Bandwidth Memory (HBM) cube. In accordance with some embodiments of the present disclosure, die stack 212 is bonded to the underlying structure through hybrid bonding, wherein electrical connectors 216 (bond pads in some embodiments) in die stack 212 are bonded to TDVs 162 and TSVs 71B through metal-to-metal direct bonding, and dielectric layer 218 of die stack 212 is bonded to gap-filling material 80 (an oxide, for example) and dielectric layer 75B through oxide-to-oxide bonding (or fusion bonding). In accordance with alternative embodiments, electrical connectors 216 are solder regions, and the bonding is solder bonding. In accordance with yet alternative embodiments, electrical connectors 216 are micro-bumps protruding beyond the surface dielectric layer 218 of die stack 212. Micro-bumps 216 may be bonded to TDVs 162 and TSVs 71B through metal-to-metal direct bonding or solder bonding, and no oxide-to-oxide bonding occurs between die stack 212 and gap filling material 80 and dielectric layer 75B.

Figure 26:
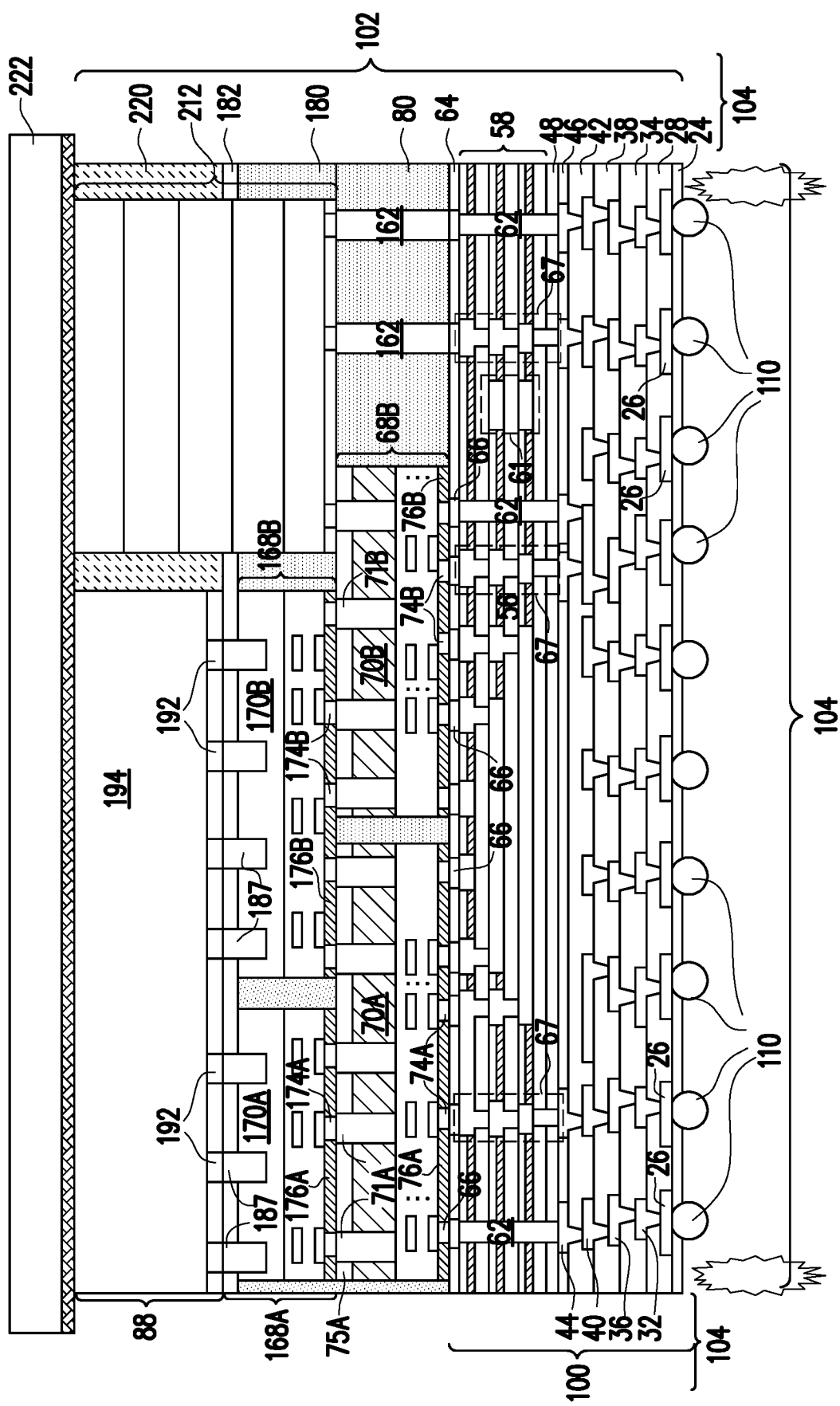

Next, gap-filling material 220 (FIG. 25) is filled into the gaps between blank die 88 and die stack 212. Gap-filling material 220 may be formed of an oxide such as silicon oxide or a polymer such as PBO or polyimide. In accordance with some embodiments in which carrier 20 (rather than silicon wafer 23) is used, the structure formed on carrier 20 is de-bonded from carrier 20, for example, by projecting light such as UV light or laser on release layer 22 to decompose release layer 22. The resulting structure is shown in FIG. 26. Carrier 20 and release layer 22 are removed from the overlying structure, which is referred to as composite wafer 102 (FIG. 26). The respective step is illustrated as step 338 in the process flow 300 as shown in FIG. 39. In accordance with some embodiments of the present disclosure in which silicon wafer 23 (rather than carrier wafer 20, FIG. 24) is used, silicon wafer 23 may be removed by mechanical grinding, CMP, or a dry etching. If needed, a carrier swap may be performed to attach another carrier 222 over the illustrated structure before carrier 20 (or silicon wafer 23) is removed, and the new carrier 222 is used to provide mechanical support during the formation of electrical connectors in the subsequent step.

Figure 27A:
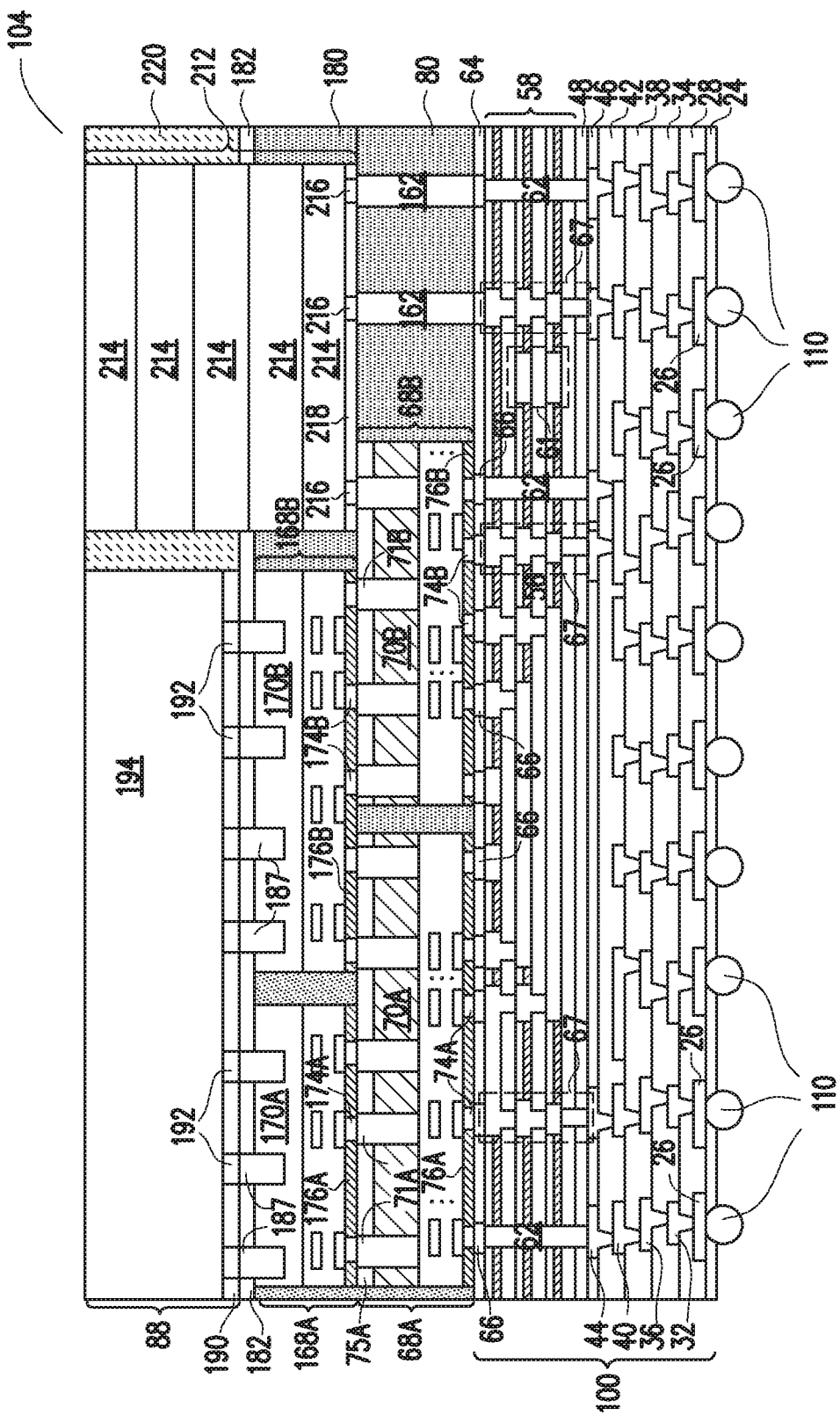

FIG. 26 also illustrates the formation of electrical connectors 110, which may penetrate through dielectric layer 24, and connect to RDLs 26. In accordance with some embodiments, a polymer layer(s) (not shown) is formed on dielectric layer 24, and electrical connectors 110 may also extend into the polymer layer. Electrical connectors 110 may be metal bumps, solder bumps, metal pillars, wire bonds, or other applicable connectors. A die-saw step is performed on composite wafer 102 to separate composite wafer 102 into a plurality of packages 104. The respective step is also illustrated as step 340 in the process flow 300 as shown in FIG. 39. Packages 104 are identical to each other, and each of packages 104 may include two layers of device dies and die stack 212. The resulting package 104 is shown in FIG. 27A.

FIGS. 27B, 27C, 27D, and 27E and FIGS. 28 through 35 illustrate the cross-sectional views of packages and the intermediate stages in the formation of the packages in accordance with some embodiments of the present disclosure. Unless specified otherwise, the materials and the formation methods of the components in these embodiments are essentially the same as the like components, which are denoted by like reference numerals in the embodiments shown in FIGS. 1 through 27A. The details regarding the formation process and the materials of the components shown in FIGS. 27B, 27C, 27D, and 27E and FIGS. 28 through 35 may thus be found in the discussion of the embodiment shown in FIGS. 1 through 27A.

Figure 27B:
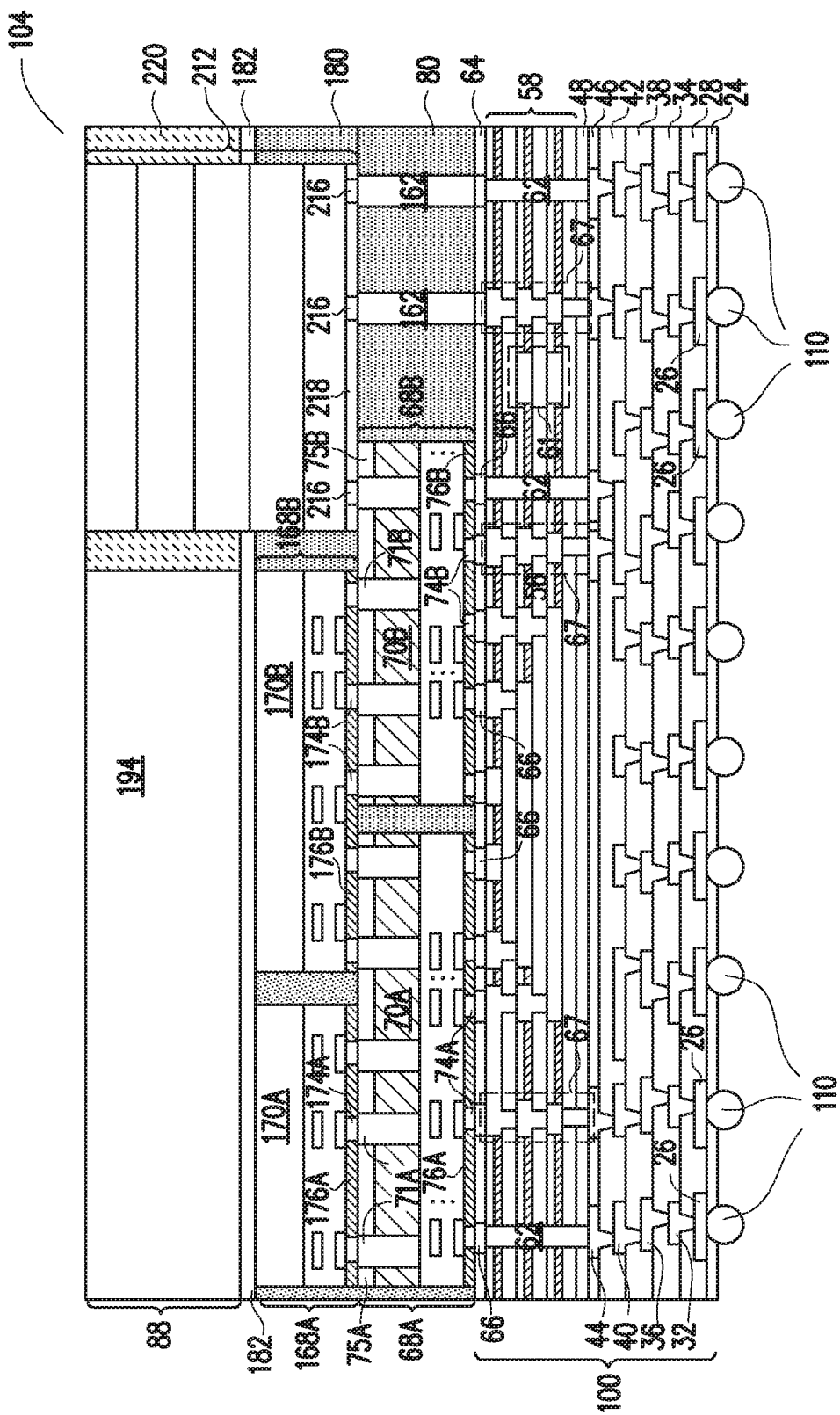
FIGS. 27B, 27C, 27D, and 27E illustrate the cross-sectional views of Si-less packages in accordance with some embodiments.

FIG. 27B illustrates the package formed in accordance with some embodiments of the present disclosure. These embodiments are similar to the embodiments shown in FIG. 27A, except that bond pads 187 and 192 and dielectric layer 190 (as in FIG. 27A) are not formed. Bulk substrate 194, which may be a blank silicon die, is bonded to dielectric layer 82 through fusion bonding.

In accordance with alternative embodiments of the present disclosure, bulk substrate 194 is a blank metal substrate. Accordingly, layer 182 in FIG. 27B may be formed of a Thermal Interface Material (TIM), which is an adhesive having a high thermal conductivity, for example, higher than about 1 W/k*m or higher than bout 5 W/k*m.

Figure 27C:
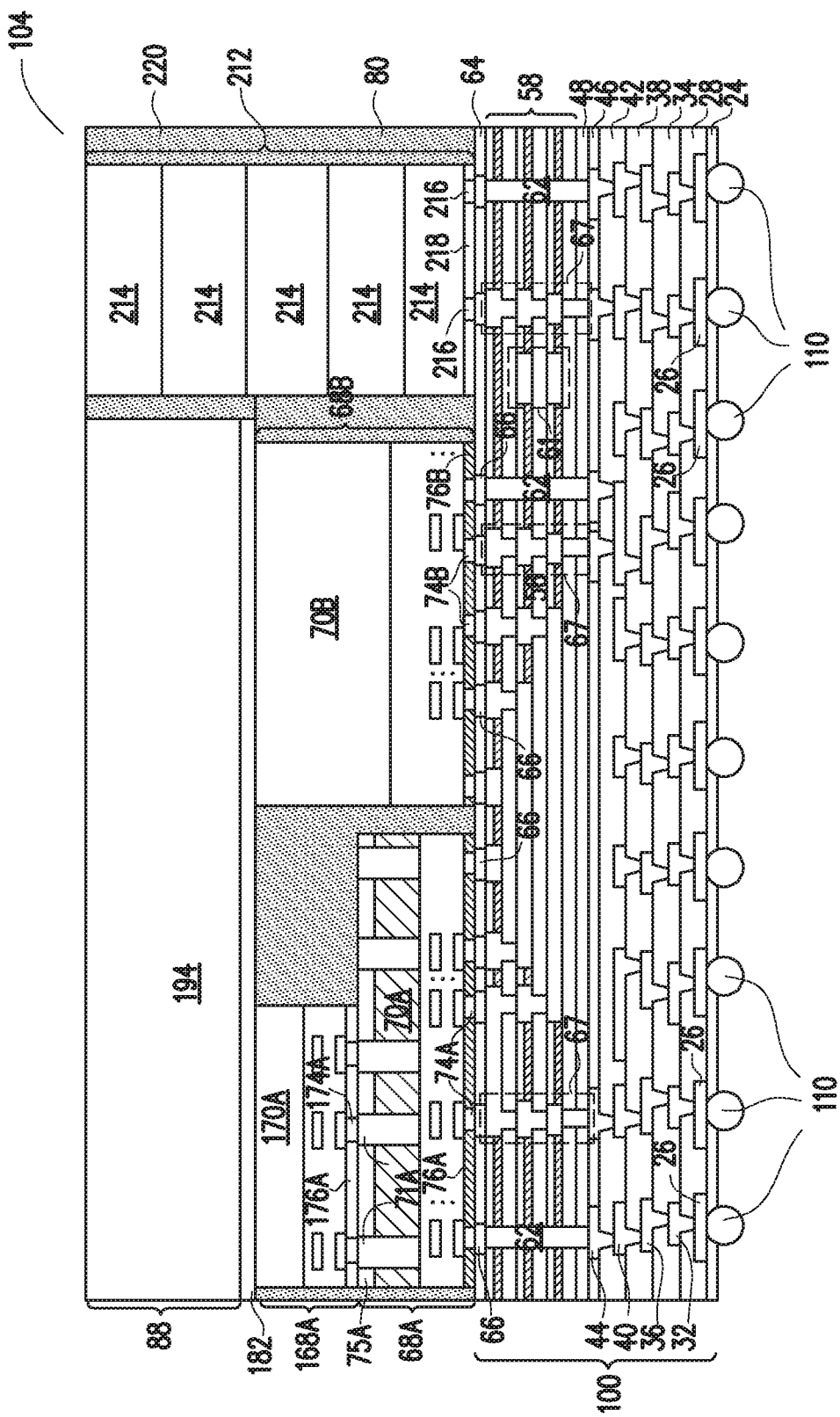

FIG. 27C illustrates the package 104 formed in accordance with some embodiments of the present disclosure. These embodiments are similar to the embodiments shown in FIG. 27A, except that device dies having different thicknesses may be placed at a same level. For example, device die 68B is thicker than device die 68A. Accordingly, device die 68B include portions extending to the same levels as device dies 68A and 168A. It is appreciated that although blank substrate 194 is illustrated as bonding to device dies 168A and 68B through fusion bonding or through an oxide/TIM 182, the same bonding structure shown in FIG. 27A, which includes bond pads 187 and bond pads 192, may be used. In accordance with some embodiments, die stack 212 has a portion level with a portion of the blank die 88.

Figure 27D:
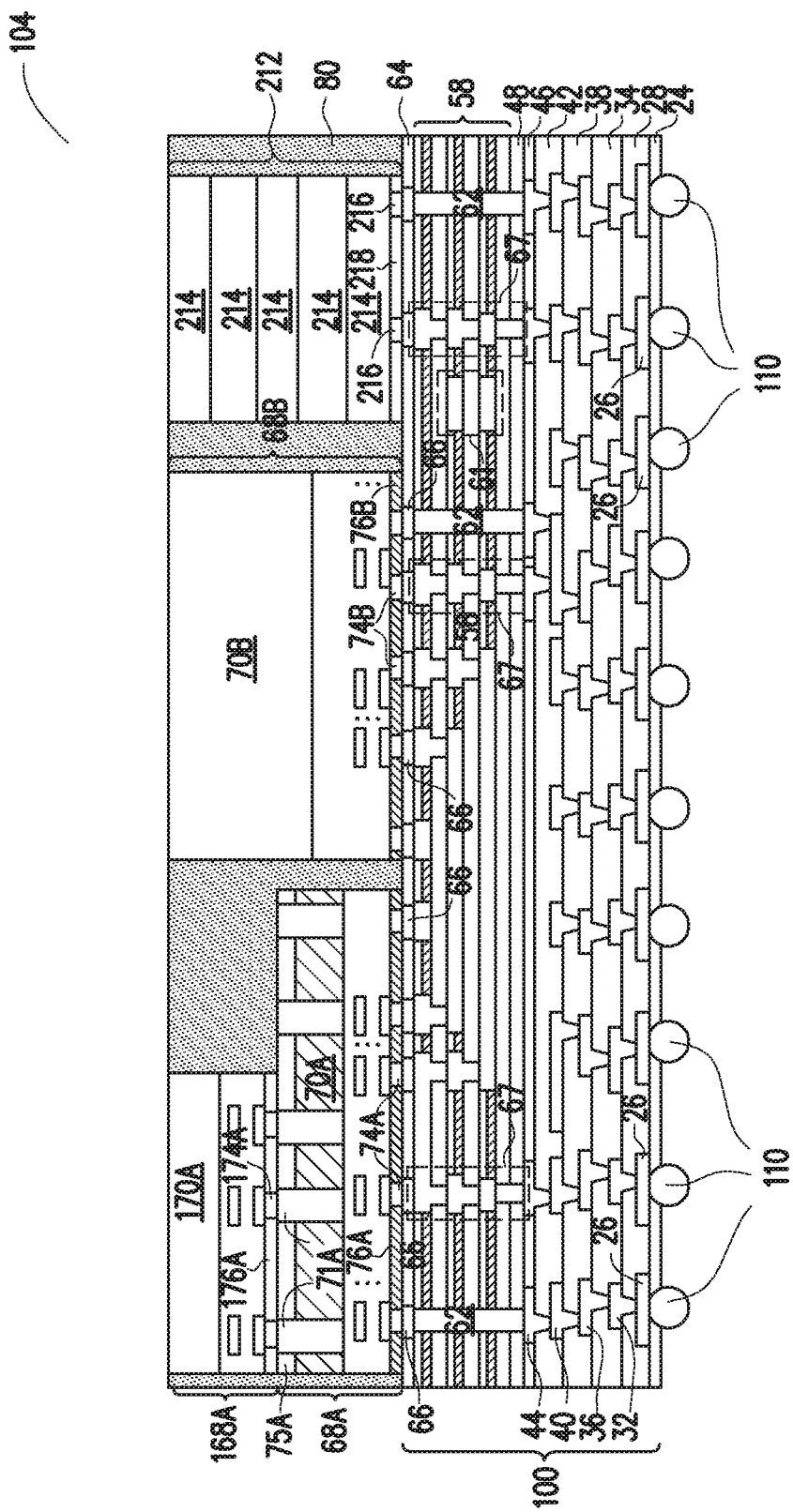

FIG. 27D illustrates the package 104 formed in accordance with some embodiments of the present disclosure. These embodiments are similar to the embodiments shown in FIG. 27C, except that no blank die 88 (as shown in FIG. 27C) is used. Die stack 212, instead of placed over gap filling material 80, extends into gap filling material 80.

Figure 27E:
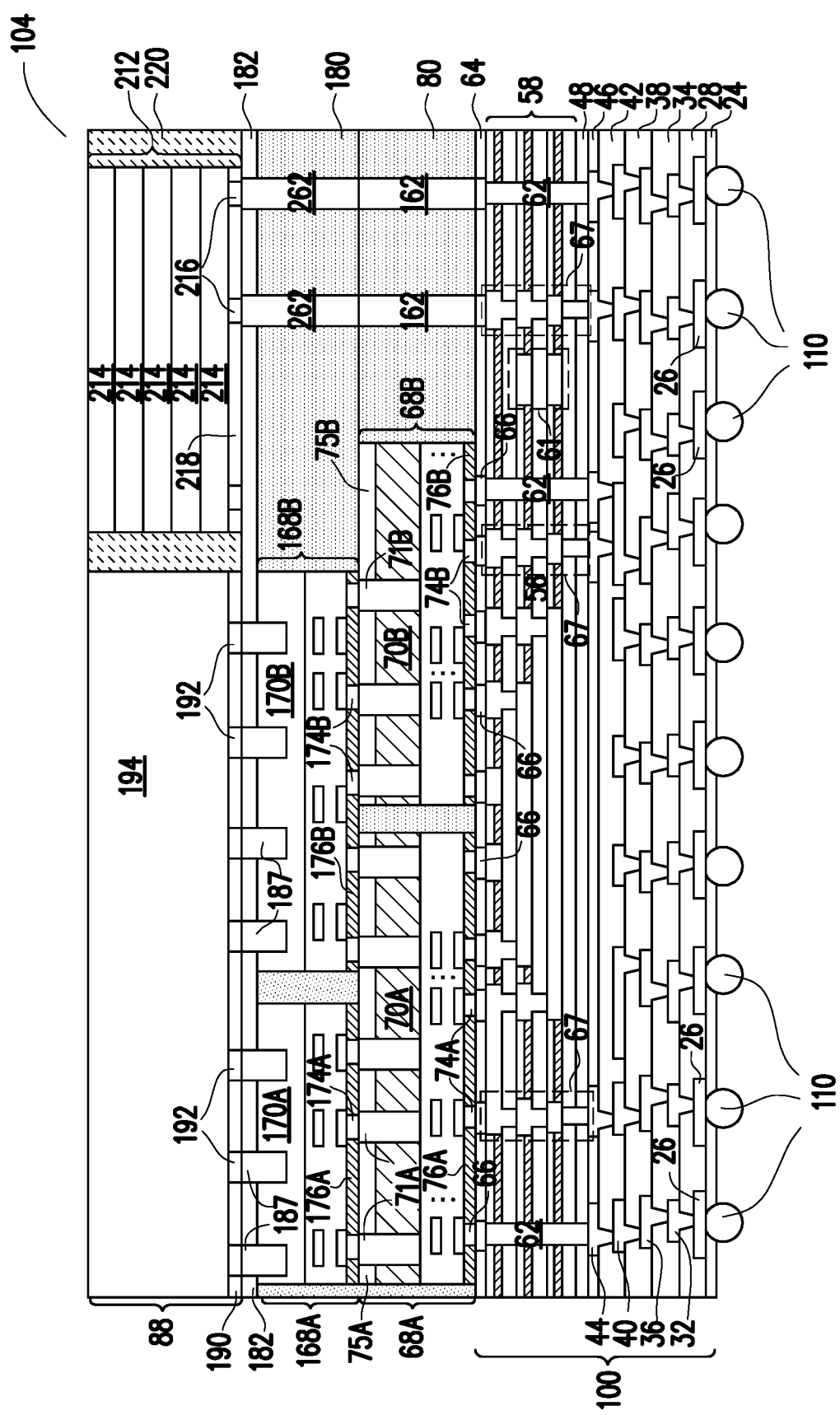
Figure 28:
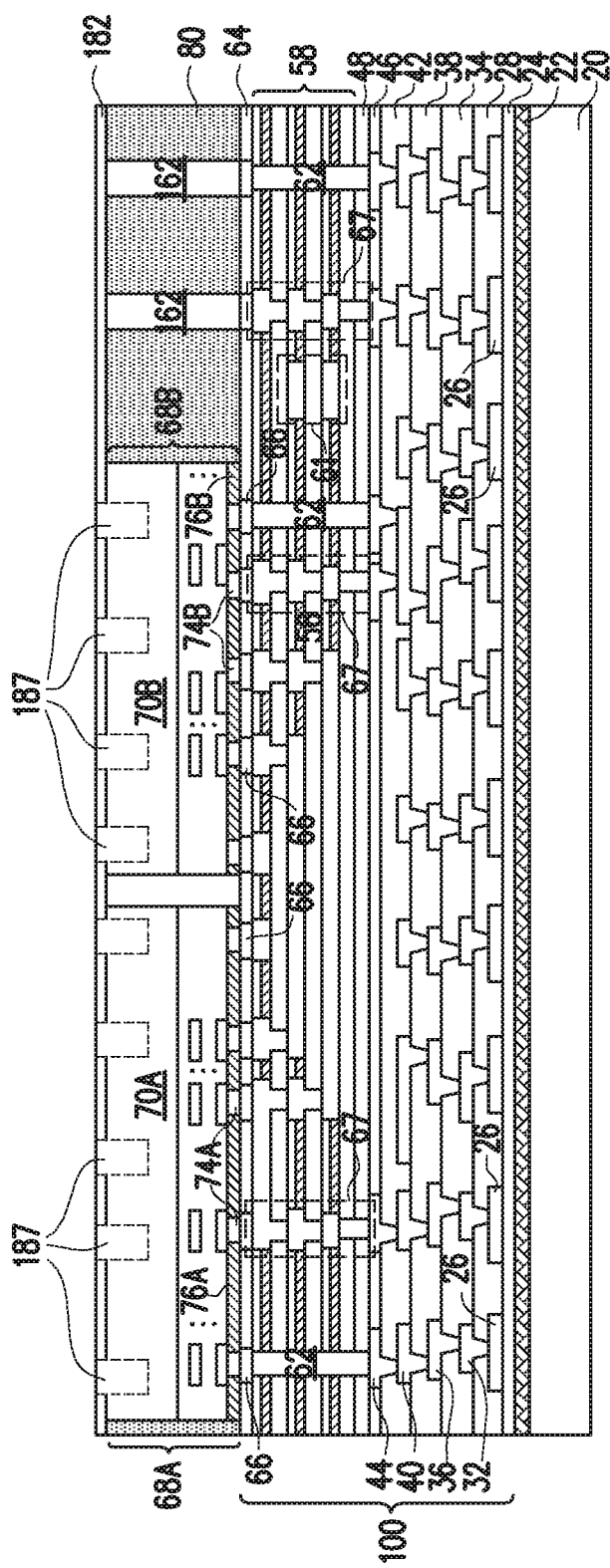
FIGS. 28 through 32 illustrate the cross-sectional views of intermediate stages in the formation of Si-less packages in accordance with some embodiments.

FIG. 27E illustrates the package 104 formed in accordance with some embodiments of the present disclosure. These embodiments are similar to the embodiments shown in FIG. 27A, except that die stack 212, instead of extending into encapsulating material 180, is located over encapsulating material 180. Through-vias 262 are formed in encapsulating material 180 to electrically couple to the underlying through vias 162 and stacked vias 67.

FIGS. 28 through 32 illustrate the cross-sectional view of intermediate stages in the formation of a package in accordance with some embodiments of the present disclosure. The respective package includes a single layer of device dies. The initial steps are similar to the steps shown in FIGS. 1 through 17. The resulting structure is also shown in FIG. 17. Next, referring to FIG. 28, dielectric layer 182 and bond pads 187 may or may not be formed, and bond pads 187 are illustrated as dashed.

Figure 29:
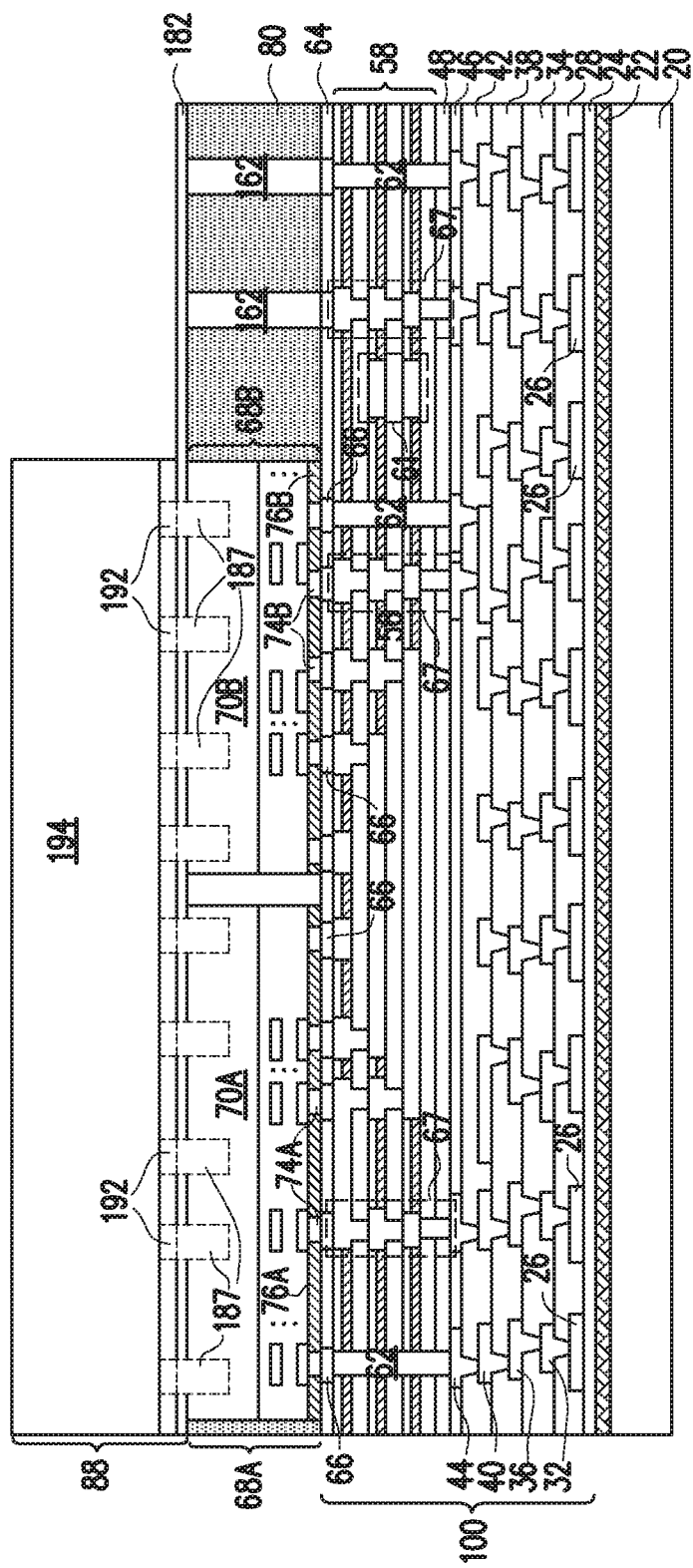
Figure 30:
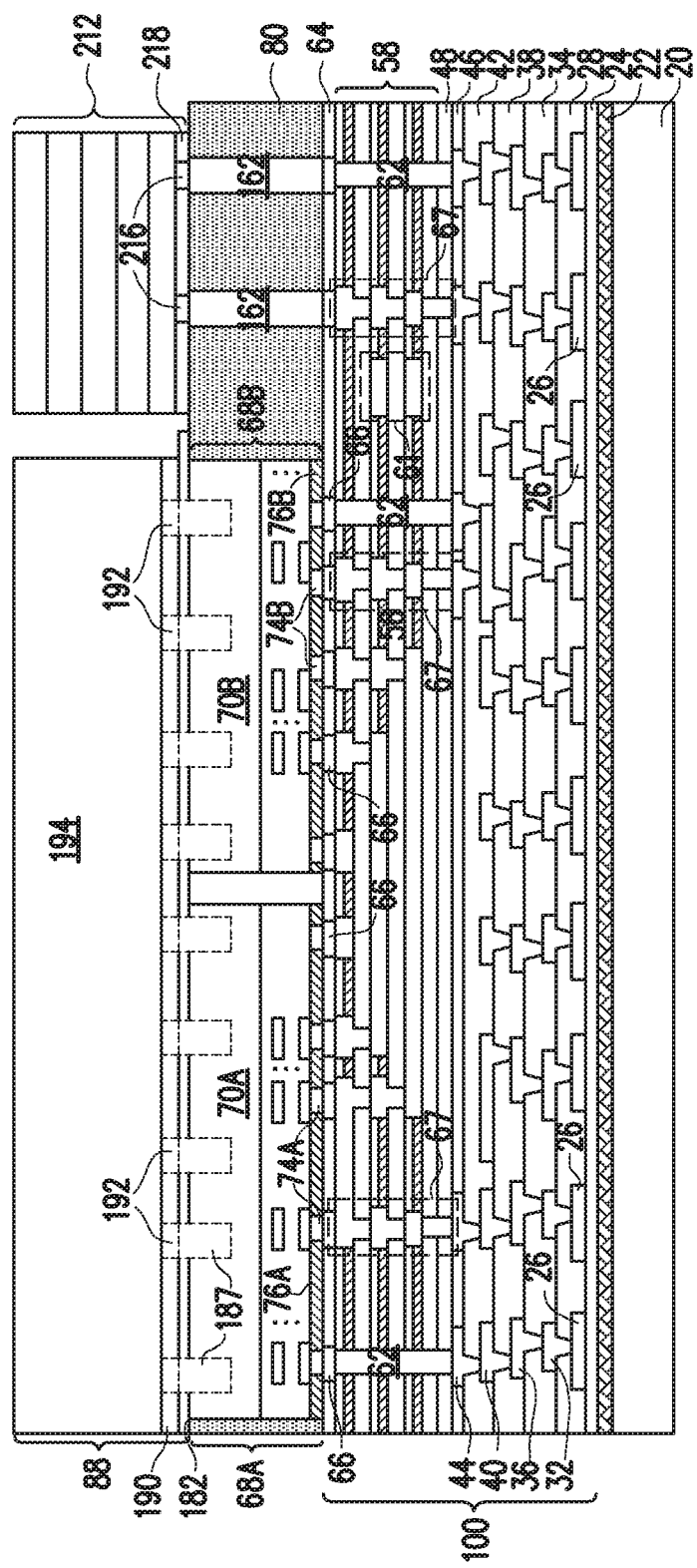
Figure 31:
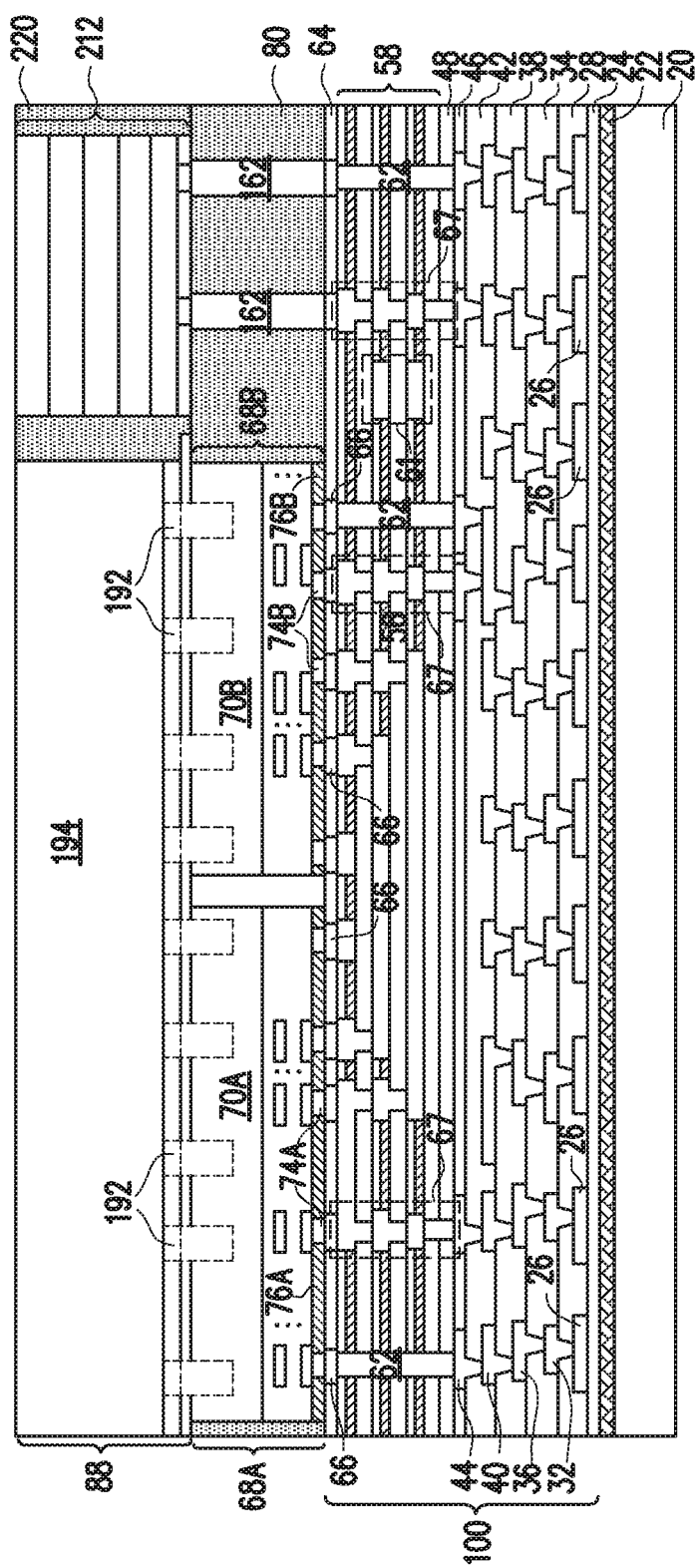
Figure 32:
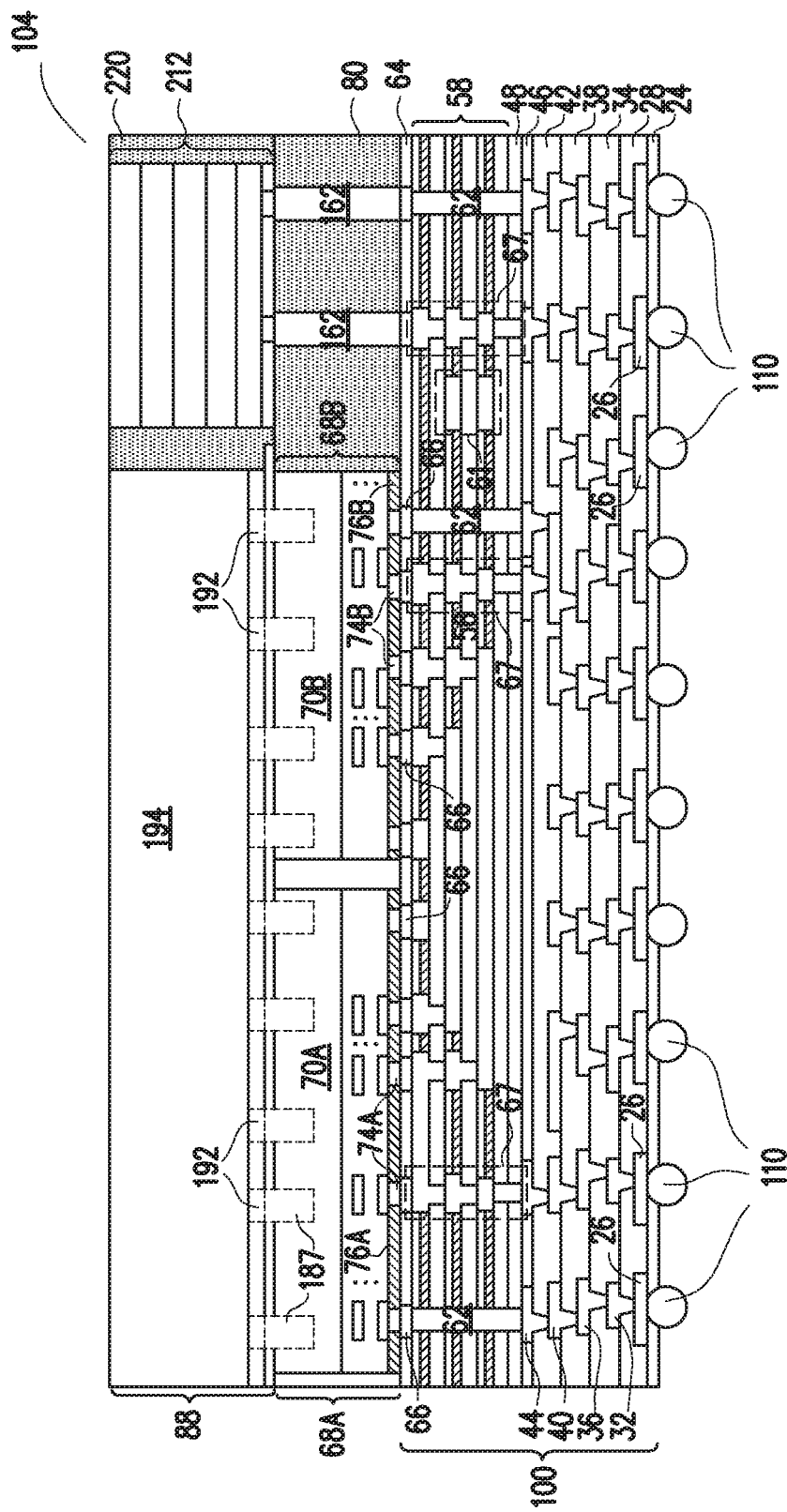

Next, as shown in FIG. 29, blank die 88 is bonded, either through hybrid bonding, fusion bonding, or adhesion through TIM. FIG. 30 illustrates the bonding of die stack 212. In FIG. 31, blank die 88 and die stack 212 are encapsulated in gap-filling material 220. A planarization may be performed to expose blank die 88. In subsequent steps, interposer 100 and the overlying structure are de-bonded from carrier 20. FIG. 32 illustrates the formation of electrical connectors 110. A die-saw is then performed to form package 104.

Figure 33:
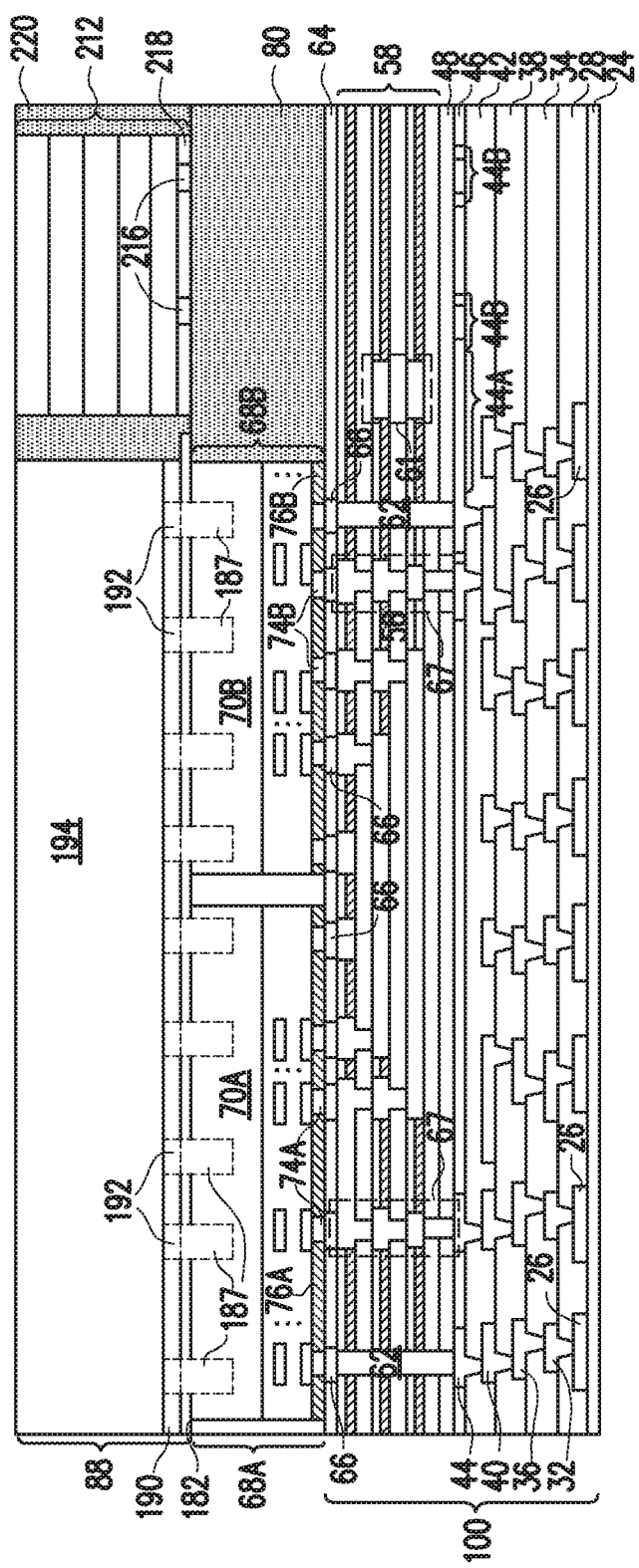
FIGS. 33 through 35 illustrate the cross-sectional views of intermediate stages in the formation of Si-less packages in accordance with some embodiments.
Figure 34:
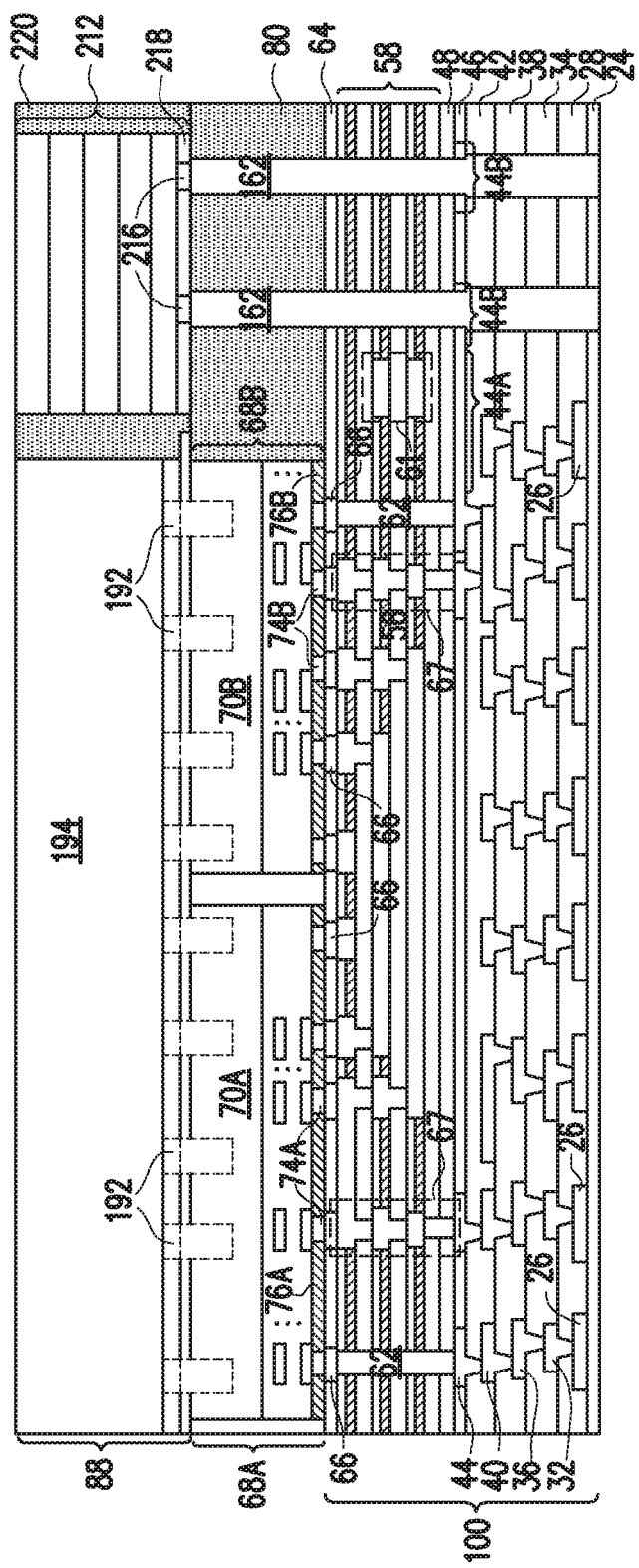
Figure 35:
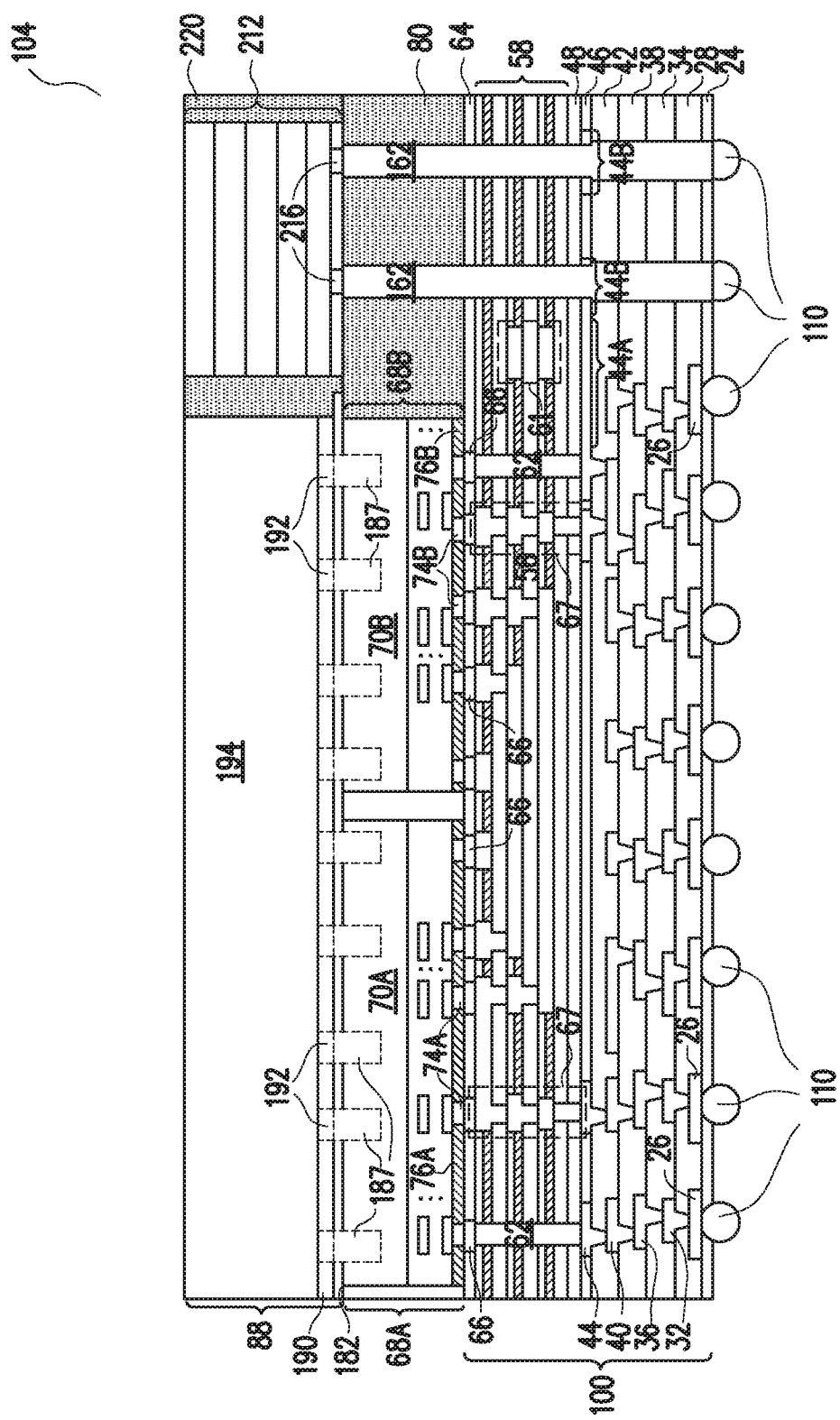

FIGS. 33 through 35 illustrate the cross-sectional view of intermediate stages in the formation of a package in accordance with some embodiments of the present disclosure. The respective package and the formation process of the structure shown in FIG. 33 are similar to what are shown in FIGS. 28 through 32, except TDVs 162 and their connecting conductive features including some of the stacked vias 67, TDVs 62, and RDLs 32, 36, and 44 are not formed. The bonding of die stack 212 to the underlying structure, for example, gap-filling material 80, is through fusion bonding. Accordingly, the bond pads 216 of stacked dies 212 are in contact with gap-filling material 80 or a dielectric layer formed thereon.

FIG. 33 includes some metal pads 44B, which are connected to RDLs 44A. Metal pads 44B and RDLs 44A are parts of RDLs 44. Metal pads 44B may form a hollow ring. FIG. 38 illustrates some exemplary metal pads 44B and the connecting RDLs 44A. Metal pads 44B are formed as rings, with the openings 45 inside the rings filled by dielectric layer 46 (FIG. 33). It is appreciated that although the metal pads 44B are illustrated as being parts of RDLs 44, the similar metal pads may be formed in any of the layers in interposer 100. Metal pads 44B are thus electrically connected to other conductive features in interposer 100.

Next, referring to FIG. 34, deep TDVs 162 are formed from the bottom side of interposer 100. The formation process includes etching the dielectric layers to form openings, and then filling the openings with conductive materials. The formation process and the materials are similar to the formation of TDVs 62. In the formation of the openings, metal pads 44B are used as etch stop layers, so that the upper portions of the openings are defined by the size and the shape of openings 45 (FIG. 38). The opening is further stopped by metal pads 216 in die stack 212. The formation of TDVs 162 is thus self-aligned by metal pads 44B. Metal pads 44B and RDLs 44A in combination electrically connect device dies 68A and 68B to die stacks 212 through TDVs 162. Electrical connectors 110 are then formed, and package 104 is resulted after the die-saw, as shown in FIG. 35.

Figure 36:
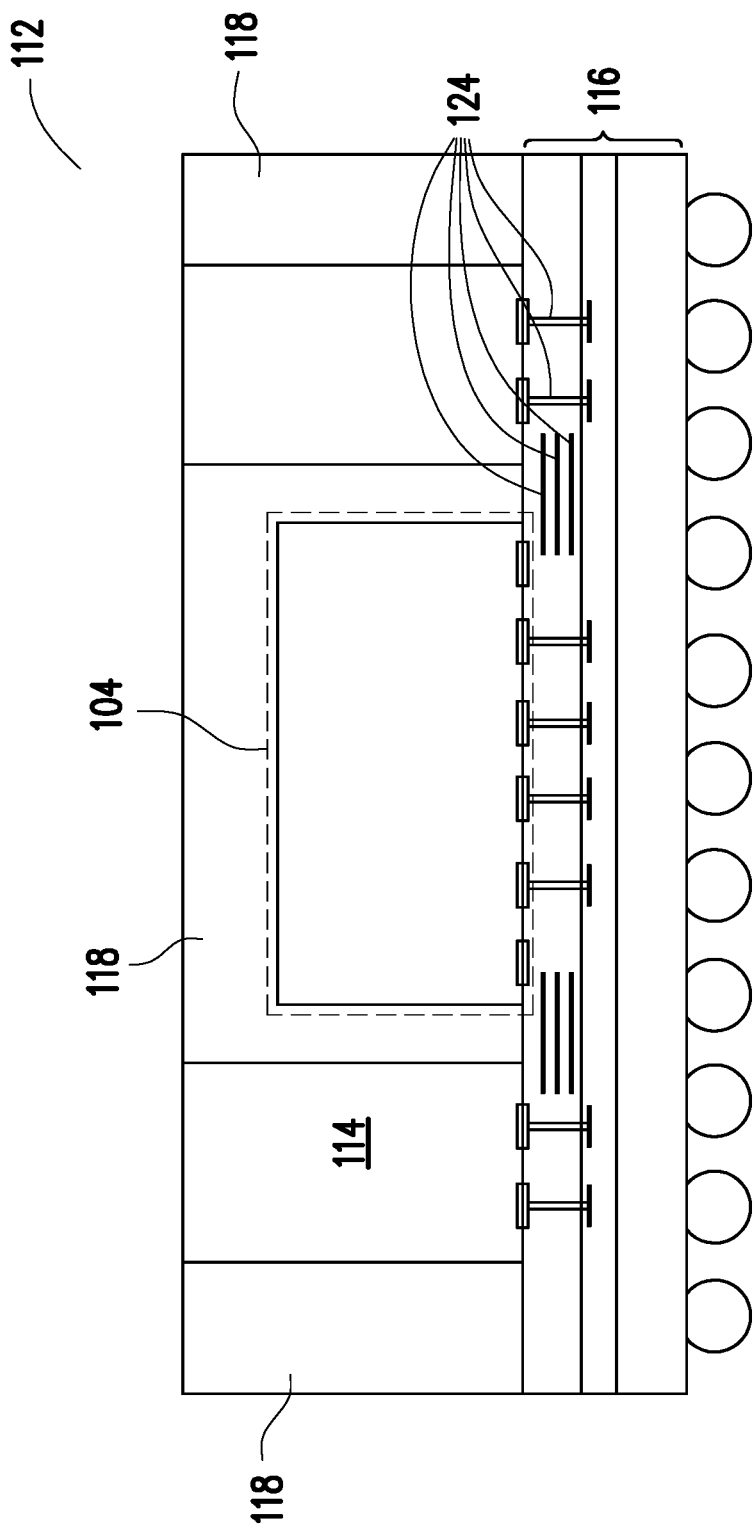
FIGS. 36 and 37 illustrate the cross-sectional views of packages embedding Si-less packages in accordance with some embodiments.

FIG. 36 illustrates a package 112 in which package 104 (refer to FIGS. 27A, 27B, 27C, 27D, 27E, 32, and 35) is embedded. The package includes memory cubes 114, which includes a plurality of stacked memory dies (not shown separately). Package 104 and memory cubes 114 are encapsulated in encapsulating material 118, which may be a molding compound. Dielectric layers and RDLs (collectively illustrated as 116) are underlying and connected to package 104 and memory cubes 114. In accordance with some embodiments of the present disclosure, dielectric layers and RDLs 116 are formed using similar materials and have similar structures as that are shown in FIGS. 1 through 11.

Figure 37:
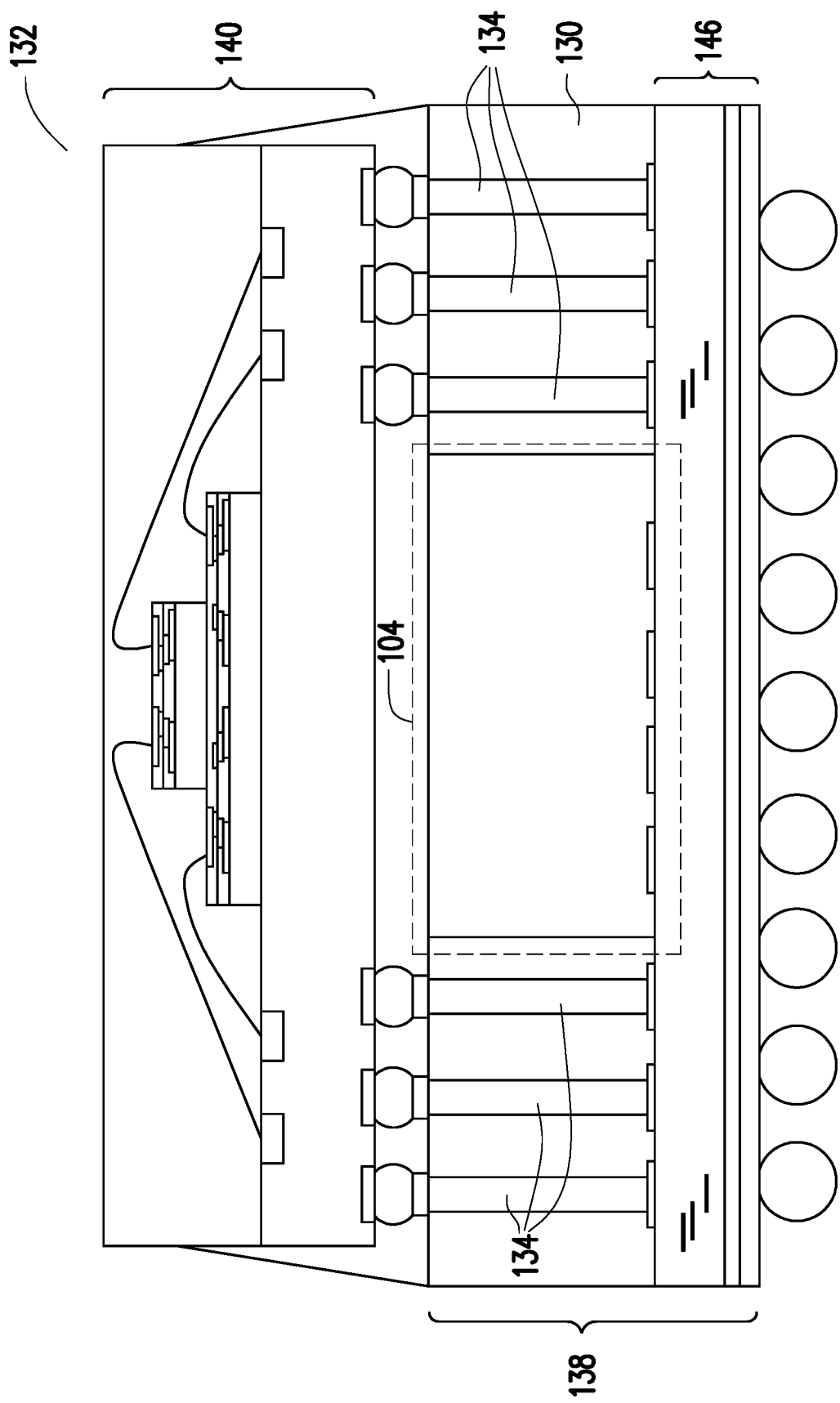

FIG. 37 illustrates Package-on-Package (PoP) structure 132, which has Integrated Fan-Out (InFO) package 138 bonded with top package 140. InFO package 138 also includes package 104 embedded therein. Package 104 and through-vias 134 are encapsulated in encapsulating material 130, which may be a molding compound. Package 104 is bonded to dielectric layers and RDLs, which are collectively referred to as 146. Dielectric layers and RDLs 146 may also be formed using similar materials and have similar structures as what are shown in FIGS. 1 through 11.

The embodiments of the present disclosure have some advantageous features. By forming the fine-pitch RDLs in interposers using the processes typically used on silicon wafers (such as damascene processes), the fine-pitch RDLs may be formed to be thin enough to provide the capability for the communication of two or more device dies all through the fine-pitch RDLs. Stacked vias are formed to replace some of the TDVs, so that the chip-area occupation is reduced. Self-aligned TDVs are formed to connect to die stack, wherein the metal pads used for aligning the TDVs are also used for connecting the self-aligned TDVs to other features and device dies in the package. Also, passive devices may also be formed when the fine-pitch RDLs are formed.

In accordance with some embodiments, a method includes forming a plurality of dielectric layers; forming a plurality of redistribution lines in the plurality of dielectric layers; when the plurality of redistribution lines is formed, simultaneously forming stacked vias in the plurality of dielectric layers, wherein the stacked vias form a continuous electrical connection penetrating through the plurality of dielectric layers; forming a dielectric layer over the stacked vias and the plurality of dielectric layers; forming a plurality of bond pads in the dielectric layer; and bonding a first device die to the dielectric layer and a first portion of the plurality of bond pads through hybrid bonding. In an embodiment, the method includes bonding a second device die to the dielectric layer and a second portion of the plurality of bond pads through hybrid bonding, wherein the plurality of redistribution lines connects the first device die to the second device die. In an embodiment, the forming the plurality of redistribution lines comprises damascene processes. In an embodiment, the method includes etching the plurality of dielectric layers to form an opening; and filling the opening to form a through-dielectric via penetrating through the plurality of dielectric layers. In an embodiment, the method includes bonding an additional device die to the first device die, wherein the additional device die is bonded directly to through-silicon vias in the first device die; forming an oxide layer over and contacting a semiconductor substrate of the additional device die; forming a bond pad extending into the oxide layer; and bonding a blank die to the oxide layer and the bond pad through hybrid bonding. In an embodiment, the plurality of dielectric layers is formed over a glass carrier; and the method further includes de-bonding the glass carrier; and after the glass carrier is de-bonded, forming a self-aligned through-dielectric via to penetrate through the plurality of dielectric layers, wherein the self-aligned through-dielectric via is stopped on a bond pad of a die stack. In an embodiment, the plurality of dielectric layers is formed over a silicon wafer, and the method further comprises grinding, polishing, or etching the silicon wafer from the plurality of dielectric layers.

In accordance with some embodiments, a method includes forming a plurality of dielectric layers; forming a plurality of redistribution lines in each of the plurality of dielectric layers; forming a passive device in the plurality of dielectric layers; forming a first through-dielectric via and a second through-dielectric via penetrating through the plurality of dielectric layers; forming a dielectric layer over the plurality of dielectric layers; forming a plurality of bond pads in the dielectric layer and electrically coupling to the first through-dielectric via, the second through-dielectric via, and the plurality of redistribution lines; and bonding a first device die and a second device die to the dielectric layer and the plurality of bond pads through hybrid bonding, wherein the first device die and the second device die are electrically interconnected through the plurality of redistribution lines, and the first device die and the second device die are connected to the first through-dielectric via and the second through-dielectric via, respectively. In an embodiment, the plurality of redistribution lines is formed using damascene processes. In an embodiment, the method includes filling a gap-filling material on opposite sides the first device die and the second device die; forming a third through-dielectric via penetrating through the gap-filling material; and bonding a die stack to the third through-dielectric via. In an embodiment, the plurality of dielectric layers is formed over a silicon wafer, and the method further comprises removing the silicon wafer from the plurality of dielectric layers. In an embodiment, the forming the first through-dielectric via and the second through-dielectric via comprises etching the plurality of dielectric layers to form a first opening and a second opening; and filling the first opening and the second opening with a conductive material. In an embodiment, the method includes, when the plurality of redistribution lines is formed, simultaneously forming stacked vias in the plurality of dielectric layers, wherein the stacked vias form a continuous electrical connection penetrating through the plurality of dielectric layers. In an embodiment, the method includes bonding a third device die on top of the first device die; forming a dielectric layer over the third device die; and bonding a blank die to the dielectric layer.

In accordance with some embodiments, a package includes a plurality of dielectric layers; a plurality of redistribution lines in each of the plurality of dielectric layers; a through-dielectric via penetrating through the plurality of dielectric layers, wherein the through-dielectric via has a substantially straight edge penetrating through the plurality of dielectric layers; stacked vias in the plurality of dielectric layers, wherein the stacked vias are electrically connected to each other to form a continuous electrical connection penetrating through the plurality of dielectric layers; a plurality of bond pads over and connected to the through-dielectric via and the plurality of redistribution lines; a first dielectric layer, with the plurality of bond pads located in the first dielectric layer; and a first device die bonded to the first dielectric layer and a first portion of the plurality of bond pads through hybrid bonding. In an embodiment, the package further includes a second device die bonded to the first dielectric layer and a second portion of the plurality of bond pads through hybrid bonding, wherein the first device die and the second device die are electrically coupled to each other through the plurality of redistribution lines. In an embodiment, the package further includes a second device die over and bonded to the first device die; a bond pad contacting a semiconductor substrate of the second device die, wherein at least a portion of the bond pad is over the semiconductor substrate of the second device die; a second dielectric layer, with the bond pad having at least a portion in the second dielectric layer; and a bulk substrate over and bonded to the second dielectric layer and the bond pad. In an embodiment, the bulk substrate is formed of silicon, and no active device and passive device is formed on the bulk substrate. In an embodiment, the bond pad further extends into the semiconductor substrate of the second device die. In an embodiment, the bond pad forms a grid.

In accordance with some embodiments, a method includes forming a plurality of dielectric layers over a silicon wafer; forming a plurality of redistribution lines in the plurality of dielectric layers; when the plurality of redistribution lines is formed, simultaneously forming stacked vias in the plurality of dielectric layers, wherein the stacked vias form a continuous electrical connection penetrating through the plurality of dielectric layers; forming a dielectric layer over the stacked vias and the plurality of dielectric layers; forming a plurality of bond pads in the dielectric layer; bonding a first device die to the dielectric layer and a first portion of the plurality of bond pads through hybrid bonding; removing the silicon wafer from the plurality of dielectric layers; and forming electrical connections electrically coupling to the plurality of redistribution lines. In an embodiment, the removing the silicon wafer comprises performing a mechanical grinding on the silicon wafer. In an embodiment, the removing the silicon wafer comprises performing a chemical mechanical polish on the silicon wafer. In an embodiment, the removing the silicon wafer comprises performing a dry etching on the silicon wafer. In an embodiment, the method includes forming a passive device in the plurality of dielectric layers. In an embodiment, the method includes encapsulating the first device die in a gap-filling material; and after the silicon wafer is removed, forming a through-dielectric via penetrating through the plurality of dielectric layers and the gap-filling material.

In accordance with some embodiments, a package includes a plurality of dielectric layers; stacked vias penetrating through the plurality of dielectric layers, wherein the stacked vias have dual damascene structures, and the stacked vias are interconnected to form a continuous electrical connection structure; a device die over the plurality of dielectric layers, wherein the device die is bonded to underlying structures through hybrid bonding, and the device die is electrically coupled to the stacked vias; and a die stack over and bonded to the device die. In an embodiment, the die stack is bonded to the device die through hybrid bonding.

In accordance with some embodiments, a package includes a plurality of dielectric layers; a passive device in the plurality of dielectric layers; a through-dielectric via penetrating through the plurality of dielectric layers; a first device die over and electrically coupling to the through-dielectric via, wherein the first device die comprises a semiconductor substrate; a dielectric layer over the first device die; a bond pad in the dielectric layer, wherein the bond pad penetrate through the dielectric layer and further extends into the semiconductor substrate of the first device die; and a die stack over and bonded to the first device die. In an embodiment, the package further includes a second device die between the first device die and the through-dielectric via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
a first die comprising a semiconductor substrate;
a first dielectric layer over and contacting the semiconductor substrate of the first die;
a second die over the first dielectric layer, wherein the first dielectric layer bonds the second die to the first die, and wherein the second die comprises a blank substrate; and
a gap-filling dielectric material encapsulating the second die therein.

2. The package of claim 1, wherein the second die further comprises a second dielectric layer, with the second dielectric layer being between and contacting both of the first dielectric layer and the blank substrate.

3. The package of claim 2 further comprising a first bond pad extending into the first dielectric layer and the semiconductor substrate, wherein the second die further comprises a second bond pad extending into the second dielectric layer, and wherein the first bond pad is bonded to the second bond pad.

4. The package of claim 3, wherein the first bond pad extends to, and stops at, an intermediate level of the semiconductor substrate of the first die, with the intermediate level being between a top surface and a bottom surface of the semiconductor substrate.

5. The package of claim 1, wherein the second die is free from active devices and passive devices in the blank substrate.

6. The package of claim 1 further comprising an additional device die bonded to the first die, wherein the additional device die and the second die are on opposing sides of the first die, and wherein the gap-filling dielectric material contacts the additional device die.

7. The package of claim 1, wherein the blank substrate comprises an additional semiconductor substrate.

8. A package comprising:
a first die, wherein the first die comprises a first semiconductor substrate;
a first gap-filling dielectric material encapsulating the first die therein;
a first dielectric layer over and contacting both of the first gap-filling dielectric material and the first die;
a second die bonded to the first dielectric layer, the second die comprising:
a blank substrate free from passive devices and active device therein; and
a second gap-filling dielectric material encapsulating the second die therein.

9. The package of claim 8 further comprising a memory stack extending into both of the first gap-filling dielectric material and the second gap-filling dielectric material.

10. The package of claim 8, wherein the blank substrate comprises a second semiconductor substrate.

11. The package of claim 8, wherein the second die further comprises a second dielectric layer contacting the blank substrate, wherein the second dielectric layer is bonded to the first dielectric layer.

12. The package of claim 8, wherein a first top surface of the blank substrate is coplanar with a second top surface of the second gap-filling dielectric material.

13. The package of claim 8 further comprising a first bond pad extending into both of the first dielectric layer and the first semiconductor substrate, wherein the second die further comprises a second bond pad bonded to the first bond pad.

14. The package of claim 13, wherein the second die further comprises a second dielectric layer, with the second bond pad being in the second dielectric layer and contacting the blank substrate.

15. A package comprising:
a first gap-filling dielectric material;
a first device die in the first gap-filling dielectric material, wherein the first device die comprises a first semiconductor substrate;
a first dielectric layer over and contacting both of the first gap-filling dielectric material and the first device die;
a first bond pad extending into the first semiconductor substrate and the first dielectric layer; and
a second die comprising:
a blank substrate;
a second dielectric layer contacting the blank substrate, wherein the second dielectric layer is bonded to the first dielectric layer; and
a second bond pad extending into the second dielectric layer, wherein the second bond pad is bonded to the first bond pad.

16. The package of claim 15, wherein the second bond pad is in physical contact with the blank substrate.

17. The package of claim 15, wherein the blank substrate comprises a second semiconductor substrate.

18. The package of claim 15, wherein the first bond pad comprises an elongate strip having a lengthwise direction parallel to a top surface of the first dielectric layer.

19. The package of claim 18, wherein the first bond pad comprises:
a first plurality of elongate strips parallel to each other, with the elongate strip being in the first plurality of elongate strips; and
a second plurality of elongate strips parallel to each other, wherein the first plurality of elongate strips join the second plurality of elongate strips to form a grid.

20. The package of claim 15 further comprising a second gap-filling dielectric material encapsulating the second die therein.

* * * * *